US009263645B2

(12) United States Patent
Sakata et al.

(10) Patent No.: US 9,263,645 B2
(45) Date of Patent: *Feb. 16, 2016

(54) LIGHT-EMITTING ELEMENT, LIGHT-EMITTING DEVICE, AND ELECTRONIC DEVICE

(71) Applicant: Semiconductor Energy Laboratory Co., Ltd., Atsugi-shi, Kanagawa-ken (JP)

(72) Inventors: Junichiro Sakata, Atsugi (JP); Hisao Ikeda, Atsugi (JP); Tomoya Aoyama, Atsugi (JP); Takahiro Kawakami, Isehara (JP); Yuji Iwaki, Atsugi (JP); Satoshi Seo, Kawasaki (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 323 days.

This patent is subject to a terminal disclaimer.

(21) Appl. No.: 13/713,101

(22) Filed: Dec. 13, 2012

(65) Prior Publication Data

US 2013/0119428 A1    May 16, 2013

Related U.S. Application Data

(63) Continuation of application No. 11/448,124, filed on Jun. 7, 2006, now Pat. No. 8,334,057.

(30) Foreign Application Priority Data

Jun. 8, 2005 (JP) ................................. 2005-167620

(51) Int. Cl.
  *H01L 51/54* (2006.01)
  *H01L 33/42* (2010.01)
  *H01L 51/52* (2006.01)
  *H01L 51/50* (2006.01)

(52) U.S. Cl.
  CPC ............ *H01L 33/42* (2013.01); *H01L 51/5262* (2013.01); *H01L 51/5088* (2013.01); *H01L 2251/558* (2013.01)

(58) Field of Classification Search
  CPC ............ H01L 51/5052; H01L 51/506; H01L 51/5068; H01L 51/5088; H01L 51/5262
  See application file for complete search history.

(56) References Cited

U.S. PATENT DOCUMENTS

| 5,404,075 | A | 4/1995 | Fujikawa et al. |
| 5,989,737 | A | 11/1999 | Xie et al. |
| 6,013,384 | A | 1/2000 | Kido et al. |
| 6,380,687 | B1 | 4/2002 | Yamazaki |
| 6,423,429 | B2 | 7/2002 | Kido et al. |
| 6,483,236 | B1 | 11/2002 | Hung |
| 6,486,601 | B1 | 11/2002 | Sakai et al. |
| 6,489,638 | B2 | 12/2002 | Seo et al. |
| 6,518,700 | B1 | 2/2003 | Friend et al. |
| 6,589,673 | B1 | 7/2003 | Kido et al. |
| 6,593,691 | B2 | 7/2003 | Nishi et al. |
| 6,608,449 | B2 | 8/2003 | Fukunaga |
| 6,642,544 | B1 | 11/2003 | Hamada et al. |
| 6,690,033 | B2 | 2/2004 | Yamazaki et al. |
| 6,692,845 | B2 | 2/2004 | Maruyama et al. |
| 6,794,278 | B2 | 9/2004 | Kido et al. |
| 6,797,920 | B2 | 9/2004 | Kitaguchi et al. |
| 6,830,494 | B1 | 12/2004 | Yamazaki et al. |
| 7,074,500 | B2 | 7/2006 | Pfeiffer et al. |
| 7,387,904 | B2 | 6/2008 | Saito et al. |
| 7,449,724 | B2 | 11/2008 | Yamazaki et al. |
| 7,732,808 | B2 | 6/2010 | Ikeda et al. |
| 8,334,057 | B2* | 12/2012 | Sakata et al. .................. 428/690 |
| 2001/0043044 | A1 | 11/2001 | Wakimoto et al. |
| 2001/0046611 | A1 | 11/2001 | Kido et al. |
| 2001/0053559 | A1 | 12/2001 | Nagao et al. |
| 2003/0111666 | A1 | 6/2003 | Nishi et al. |
| 2003/0189401 | A1 | 10/2003 | Kido et al. |
| 2004/0100189 | A1* | 5/2004 | Adachi et al. .................. 313/504 |
| 2004/0140758 | A1 | 7/2004 | Raychaudhuri et al. |

(Continued)

FOREIGN PATENT DOCUMENTS

| EP | 0 855 848 | 7/1998 |
| EP | 0 948 063 | 10/1999 |

(Continued)

OTHER PUBLICATIONS

International Search Report for Application No. PCT/JP2004/019466 dated Apr. 12, 2005.
Written Opinion for Application No. PCT/JP2004/019466 dated Apr. 12, 2005.
International Search Report for Application No. PCT/JP2004/014412 dated Mar. 22, 2005.
Written Opinion for Application No. PCT/JP2004/014412 dated Mar. 22, 2005.

(Continued)

*Primary Examiner* — Michael H Wilson
(74) *Attorney, Agent, or Firm* — Robinson Intellectual Property Law Office; Eric J. Robinson

(57) ABSTRACT

The present invention provides a light-emitting element, a light-emitting device and an electronic device in which an optical path length through which generated light goes can be changed easily. The present invention provides a light-emitting element including a light-emitting layer between a first electrode and a second electrode, and a mixed layer in contact with the first electrode; in which the light-emitting layer includes a light-emitting substance; the mixed layer includes a hole transporting substance and a metal oxide showing an electron accepting property to the hole transporting substance, and has a thickness of 120 to 180 nm, and when a voltage is applied between the first electrode and the second electrode such that a potential of the first electrode is higher than that of the second electrode, the light-emitting substance emits light.

12 Claims, 17 Drawing Sheets

(56) References Cited

U.S. PATENT DOCUMENTS

| | | |
|---|---|---|
| 2005/0072977 A1 | 4/2005 | Saito et al. |
| 2005/0084712 A1 | 4/2005 | Kido et al. |
| 2005/0084713 A1 | 4/2005 | Kido et al. |
| 2005/0084994 A1 | 4/2005 | Yamazaki et al. |
| 2005/0098207 A1 | 5/2005 | Matsumoto et al. |
| 2005/0106419 A1 | 5/2005 | Endoh et al. |
| 2005/0170208 A1 | 8/2005 | Yatsunami et al. |
| 2005/0186446 A1 | 8/2005 | Shitagaki et al. |
| 2005/0248267 A1 | 11/2005 | Gyoutoku et al. |
| 2006/0008740 A1 | 1/2006 | Kido et al. |
| 2006/0284189 A1* | 12/2006 | Sakata et al. .............. 257/79 |
| 2007/0114527 A1 | 5/2007 | Kumaki et al. |
| 2007/0152572 A1 | 7/2007 | Kawakami et al. |
| 2007/0170843 A1 | 7/2007 | Kawamura et al. |
| 2007/0172699 A1 | 7/2007 | Nakashima et al. |
| 2008/0203385 A1 | 8/2008 | Saito et al. |
| 2009/0026922 A1 | 1/2009 | Iwaki et al. |
| 2010/0096627 A1 | 4/2010 | Ikeda et al. |
| 2010/0207518 A1 | 8/2010 | Ikeda et al. |

FOREIGN PATENT DOCUMENTS

| | | |
|---|---|---|
| EP | 1 009 198 | 6/2000 |
| EP | 1 089 361 | 4/2001 |
| EP | 1 160 891 | 12/2001 |
| EP | 1 261 042 | 11/2002 |
| EP | 1 347 670 A | 9/2003 |
| EP | 1 351 558 | 10/2003 |
| EP | 1 521 316 A | 4/2005 |
| EP | 1 524 706 | 4/2005 |
| EP | 1 524 707 | 4/2005 |
| EP | 1 530 245 | 5/2005 |
| EP | 1 617 493 A | 1/2006 |
| EP | 1 722 602 A | 11/2006 |
| EP | 2 276 088 A | 1/2011 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-267658 | 9/1994 |
| JP | 06-290873 | 10/1994 |
| JP | 07-312289 | 11/1995 |
| JP | 09-063771 A | 3/1997 |
| JP | 10-255985 | 9/1998 |
| JP | 10-270171 | 10/1998 |
| JP | 10-308284 | 11/1998 |
| JP | 2824411 | 11/1998 |
| JP | 11-251067 | 9/1999 |
| JP | 11-297474 A | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-102175 | 4/2001 |
| JP | 2001-244079 | 9/2001 |
| JP | 2002-015873 | 1/2002 |
| JP | 2002-056973 A | 2/2002 |
| JP | 2002-190386 A | 7/2002 |
| JP | 2002-332567 | 11/2002 |
| JP | 2002-367784 | 12/2002 |
| JP | 2003-229278 | 8/2003 |
| JP | 2003-272860 | 9/2003 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 | 2/2005 |
| JP | 2005-093402 A | 4/2005 |
| JP | 2005-109469 A | 4/2005 |
| JP | 2005-123094 | 5/2005 |
| JP | 2005-123095 | 5/2005 |
| JP | 2005-129500 A | 5/2005 |
| JP | 2005-135600 A | 5/2005 |
| JP | 2005-166637 | 6/2005 |
| JP | 2005-251587 | 9/2005 |
| JP | 2005-251639 A | 9/2005 |
| JP | 2006-024791 A | 1/2006 |
| WO | WO 00/01203 | 1/2000 |
| WO | WO 02/41414 | 5/2002 |
| WO | WO 2004/094389 A1 | 11/2004 |
| WO | WO 2005/006460 | 1/2005 |
| WO | WO 2005/031798 | 4/2005 |
| WO | WO 2005/064995 | 7/2005 |
| WO | WO 2006/035952 A1 | 4/2006 |
| WO | WO 2006/057420 | 6/2006 |
| WO | WO 2006/059736 | 6/2006 |
| WO | WO 2006/115232 | 11/2006 |

OTHER PUBLICATIONS

Tokito et al., *Metal Oxides as a Hole-Injecting Layer for an Organic Electroluminescent Device*, J. Phys. D: Appl. Phys. (Journal of Physics D: Applied Physics), 1996, vol. 29, pp. 2750-2753.

Nakada et al., "27aZL-12 Multi Photon Emission Organic EL Devices Using Charge-Transfer Complex as Charge Generation Layer,", 63$^{rd}$ Applied Physics-Related Combined Seminar, Seminar Proceedings, Sep. 24, 2002, p. 1165.

* cited by examiner

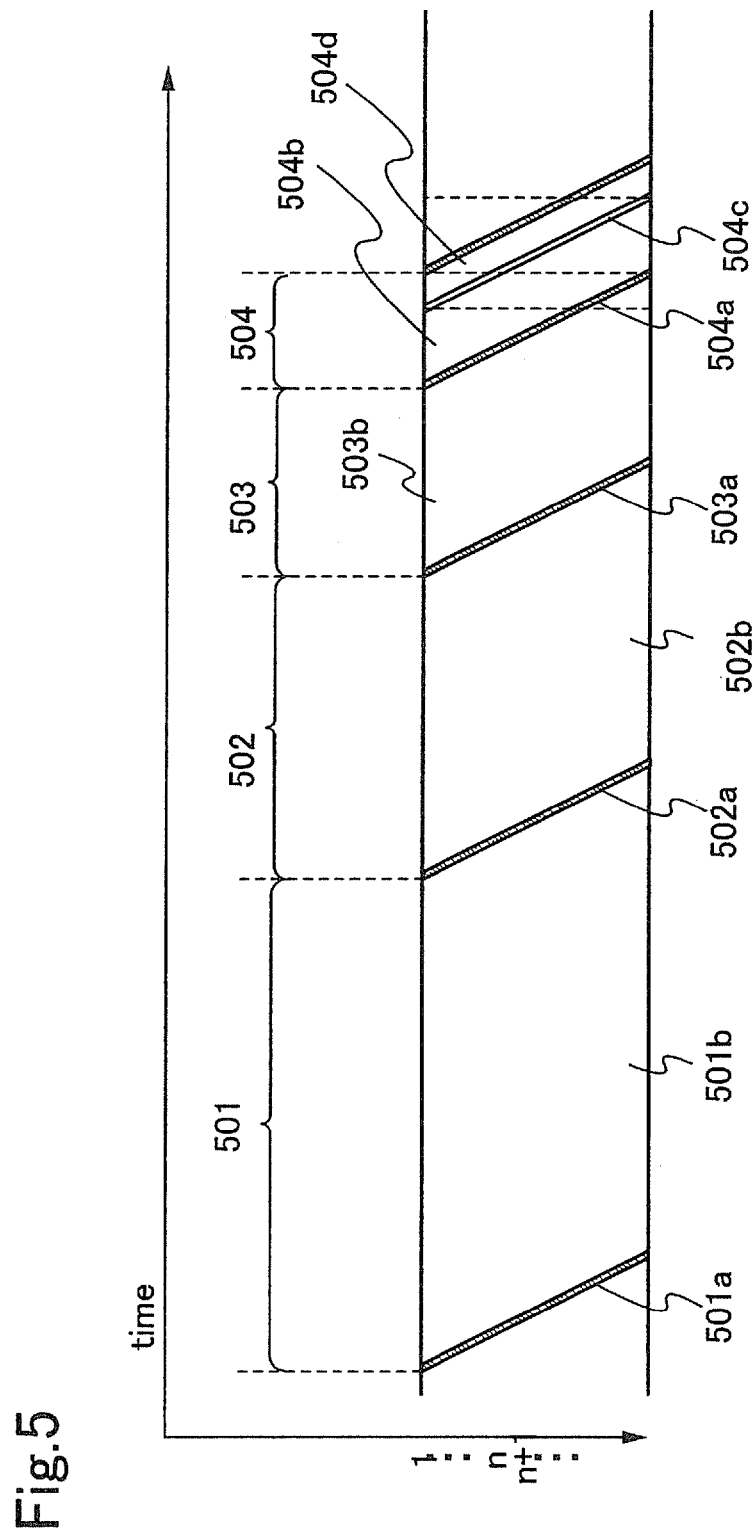

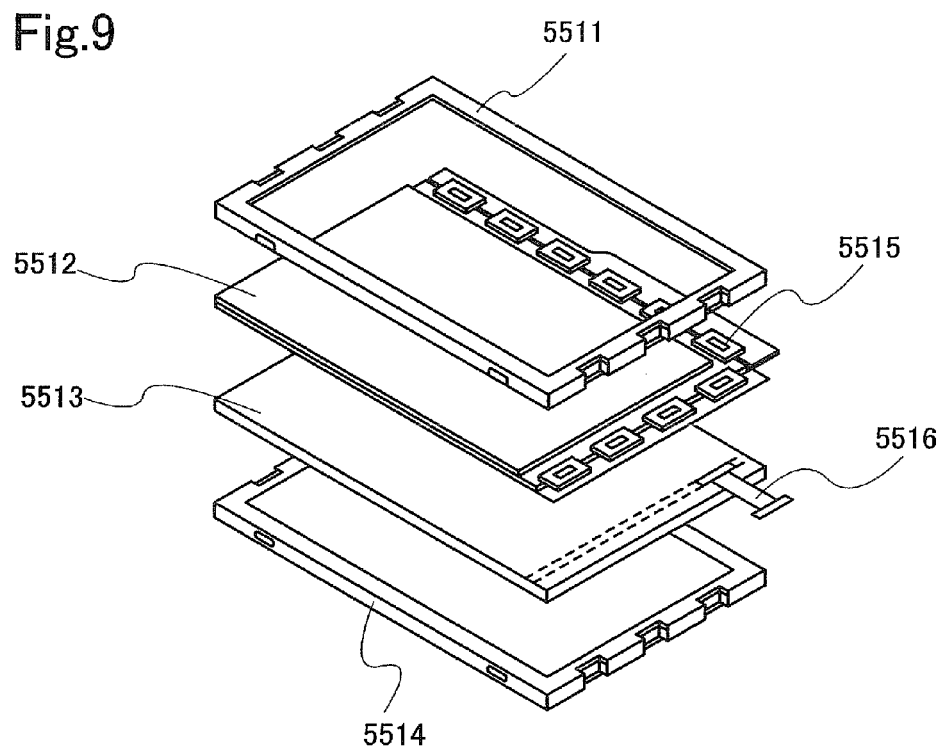

LIGHT-EMITTING ELEMENT, LIGHT-EMITTING DEVICE, AND ELECTRONIC DEVICE

BACKGROUND OF THE INVENTION

1. Field of the Invention

The present invention relates to light-emitting elements which emit light by current excitation, and light-emitting devices and electronic devices using the same.

2. Description of the Related Art

In EL displays which have been commercialized recently, images are displayed by changing and combining luminance, emission time or the like of red (R), green (G) and blue (B) luminescences. R, G and B luminescences can each be obtained by driving a light-emitting element in which a light-emitting layer is formed between a pair of electrodes. In such light-emitting elements, at least one of the electrodes is formed of a transparent conductive film such as ITO (indium tin oxide) so that visible light can pass therethrough.

In such light-emitting elements, when a distance between a light-emitting layer and an electrode through which light passes is not suitable (in other words, an optical path length is not controlled suitably), colors are changed strangely or an extraction efficiency of luminescence decreases. In order to solve such problems, a technique shown in Reference 1 has been proposed, for example (Reference 1: Japanese Patent Application Laid-Open No. 2001-102175).

Forming a metal doping layer to be in contact with a cathode as described in Reference 1 is thought to be effective. However, a problem remains with the technique as described in Reference 1 in that a distance between a light-emitting layer and an anode cannot be adjusted. In addition, a metal such as Mg or Li as described in Reference 1 can be a cause of reduction of a light-transmitting property.

SUMMARY OF THE INVENTION

It is an object of the present invention to provide a light-emitting element, a light-emitting device and an electronic device in which an optical path length through which generated light goes can be changed easily.

One feature of the present invention is a light-emitting element including a light-emitting layer between a first electrode and a second electrode, and a mixed layer in contact with the first electrode. The mixed layer includes a hole transporting substance and a metal oxide showing an electron accepting property to the hole transporting substance. A total film thickness of layers formed between the light-emitting layer and the first electrode is preferably in a range of 50 nm to 300 nm, and thus, the mixed layer is preferably formed to have a thickness of 10 nm to 250 nm (more preferably, 120 nm to 180 nm). By forming the mixed layer to have such a thickness, the light can be extracted to outside of the light-emitting element efficiently, especially when a light-emitting element for green emits light. Further, in the mixed layer, the metal oxide is preferably included at a percentage of 3 vol % to 24 vol % of the volume of the mixed layer, more preferably, a percentage of 7 vol % to 16 vol %, and most preferably, a percentage of 8 vol % to 12 vol %. Accordingly, a light-emitting element can operate more efficiently, and a light-emitting element with a small variation in driving voltage which is dependent on the thickness of the mixed layer, can be manufactured.

As the metal oxide, molybdenum oxide, vanadium oxide, ruthenium oxide, rhenium oxide or the like can be used, and of these oxides, molybdenum oxide is preferably used. Molybdenum oxide itself has low hygroscopicity. When molybdenum oxide is heated in a vacuum, it does not produce moisture; thus a light-emitting element with very little degradation caused by moisture can be manufactured. Moreover, molybdenum oxide can be easily stored and handled; therefore, it is a suitable material for mass production. In addition, molybdenum trioxide is preferred as a metal oxide, since it has superior deposition stability. As a hole transporting substance, 4,4'-bis[N-(1-naphthyl)-N-phenylamino]biphenyl, 4,4'-bis[N-(3-methylphenyl)-N-phenylamino]biphenyl, 1,3,5-tris[N,N-di(m-tolyl)amino]benzene, 4,4',4"-tris(N-carbazolyl)triphenylamine, 4,4'-bis{N-[4-(N,N-di-m-tolylamino)phenyl]-N-phenylamino}biphenyl or the like can be used.

By implementing the present invention, a light-emitting element can be obtained, which has a small variation of driving voltage which is dependent on a thickness of layers formed between an electrode serving as an anode and a light-emitting layer, and in which a length of an optical path can be easily changed. Further, a light-emitting device and an electronic device which can operate with low power consumption can be obtained by incorporating such a light-emitting element. Moreover, by implementing the present invention, reduction of extraction efficiency caused by a substance included in a layer provided so as to adjust an optical path length is small, and an excellent light-emitting element, and a light-emitting device and an electronic device which can operate with low power consumption can be obtained by incorporating the light-emitting element.

Moreover, in full-color display devices, in order to obtain white light emission by luminescences of three primary colors, blue, green and red, when luminescences of the three primary colors, blue, green and red are emitted at vertexes of NTSC (National Television Standards Committee), it is necessary to mix luminescence of each color with a ratio of approximately 1:6:3 (=blue:green:red). In other words, a lot of power is consumed, because green emission is needed at a maximum luminance. Thus, by implementing the present invention, power consumption of full-color display devices can be reduced by reducing power consumption of a light-emitting element for green.

BRIEF DESCRIPTION OF DRAWINGS

In the accompanying drawings:

FIG. 5 is a flame diagram describing a method for driving a pixel included in a light-emitting device according to an aspect of the present invention;

FIG. 9 shows a lighting device to which the present invention is applied;

DETAILED DESCRIPTION OF THE INVENTION

Hereinafter, the embodiment modes of the present invention will be described. The present invention is not limited to the following description, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

Embodiment Mode 1

One mode of a light-emitting element of the present invention will be described with reference to FIG. 1.

Figure 1:
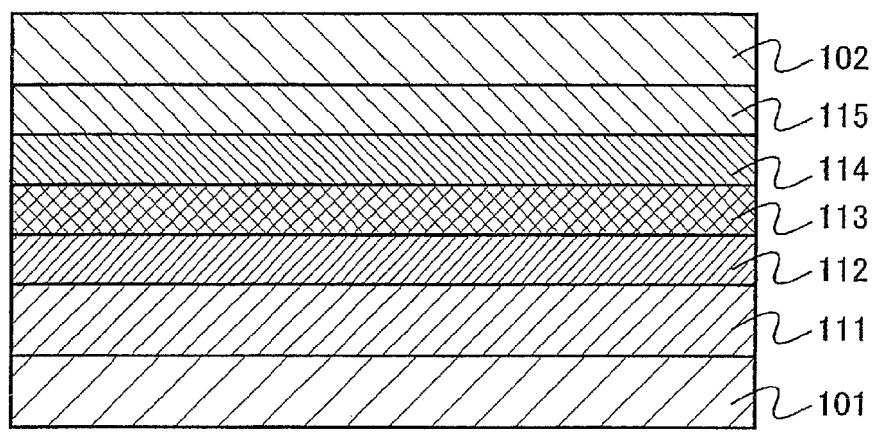
FIG. 1 shows one mode of a light-emitting element according to an aspect of the present invention.

In FIG. 1, a light-emitting element having a light-emitting layer 113 between a first electrode 101 and a second electrode 102 is shown. In the light-emitting element shown in FIG. 1, a mixed layer 111 is provided between the light-emitting layer 113 and the first electrode 101. In addition, a hole transporting layer 112 is provided between the light-emitting layer 113 and the mixed layer 111, and an electron transporting layer 114 and an electron injecting layer 115 are provided between the light-emitting layer 113 and the second electrode 102. In such a light-emitting element, when a voltage is applied between the first electrode 101 and the second electrode 102 so that a potential of the first electrode 101 is higher than a potential of the second electrode 102, holes are injected from the first electrode 101 side to the light-emitting layer 113, and electrons are injected from the second electrode 102 side to the light-emitting layer 113. In other words, the first electrode 101 has a function of an anode and the second electrode 102 has a function of a cathode. Subsequently, holes and electrons injected to the light-emitting layer 113 are recombined. A light-emitting substance is included in the light-emitting layer 113, and the light-emitting substance moves into an excited state due to excitation energy generated by the recombination. The light-emitting substance in the excited state emits light upon returning to a ground state.

The first electrode 101, the second electrode 102, and each of the layers provided therebetween are described in detail below.

There is no particular limitation on a substance for forming the first electrode 101; however, in addition to a substance having a high work function, such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride, a substance having a low work function such as aluminum or magnesium can also be used. This is because holes are generated from the mixed layer 111 when a voltage is applied between the electrodes in the light-emitting element of the present invention.

As a substance forming the second electrode 102, a substance having a low work function such as aluminum or magnesium is preferable; however, when an electron-generating layer is provided between the second electrode 102 and the light-emitting layer 113, a substance having a high work function, such as indium tin oxide, indium tin oxide containing silicon oxide, indium oxide containing 2 to 20 wt % zinc oxide, gold (Au), platinum (Pt), nickel (Ni), tungsten (W), chromium (Cr), molybdenum (Mo), iron (Fe), cobalt (Co), copper (Cu), palladium (Pd), or tantalum nitride, can also be used. Accordingly, a substance which is suitable as a substance for forming the second electrode 102 may be selected as appropriate, depending on a property of a layer or layers to be provided between the second electrode 102 and the light-emitting layer 113.

Note that the first electrode 101 and the second electrode 102 are preferably formed so that either one or both of the electrodes can transmit light that is emitted.

The mixed layer 111 is a layer including a hole transporting substance and a metal oxide. There is no limitation on a hole transporting substance; however, it is preferable that the hole transporting substance has a hole mobility of $1 \times 10^{-6}$ cm$^2$/Vs or higher, (more preferably $1 \times 10^{-6}$ to $1 \times 10^{0}$ cm$^2$/Vs). Holes injected from a metal oxide can be transported efficiently by using a hole transporting material having a hole mobility of $1 \times 10^{-6}$ cm$^2$/Vs or higher. Here, "hole transporting substance" refers to a substance having a higher hole mobility than electron mobility, and preferably, a substance for which a value of a ratio of hole mobility to electron mobility (=hole mobility/electron mobility) is larger than 100. As examples of the hole transporting substance, 4,4'-bis[N-(1-naphthyl)-N-phenylamino]biphenyl (abbreviated as NPB), 4,4'-bis[N-(3-methylphenyl)-N-phenylamino]biphenyl (abbreviated as TPD), 1,3,5-tris[N,N-di(m-tolyl)amino]benzene (abbreviated as m-MTDAB), 4,4',4"-tris(N-carbazolyl)triphenylamine (abbreviated as TCTA), 4,4'-bis{N-[4-(N,N-di-m-tolylamino)phenyl]-N-phenylamino}biphenyl (abbreviated as DNTPD) and the like can be given. Further, as the metal oxide, a substance showing an electron accepting property to the hole transporting substance is preferable. As examples of a metal oxide, molybdenum oxide, vanadium oxide, ruthenium oxide, rhenium oxide and the like can be given. Further, metal oxides such as titanium oxide, chromium oxide, zirconium oxide, hafnium oxide, tantalum oxide, tungsten oxide, and silver oxide can also be used. By combining a metal oxide and a hole transporting substance in this manner, a light-emitting element in which increase of driving voltage dependent on a film thickness of the mixed layer 111 is extremely small, and in which a distance from the light-emitting layer 113 to the first electrode 101 can be freely changed, can be obtained. Moreover, metal oxides such as those cited here are superior in light-transmitting properties to metals such as Li and Mg. Thus, light can be emitted to the outside of the light-emitting element easily and decrease in extraction efficiency can be prevented. Such a metal oxide is preferably included in the mixed layer 111 such that a mass ratio of the metal oxide to the hole transporting substance is 0.1 to 1 (=metal oxide/hole transporting substance), or a molar ratio is 0.4 to 4 (=metal oxide/hole transporting material), or a volume percentage of the metal oxide to the mixed layer 111 (mixing ratio) is 3 to 24 vol %, more preferably 7 to 16 vol %, and most preferably 8 to 12 vol %. A total thickness of layers formed between the light-emitting layer 113 and the first electrode 101 is preferably 50 to 300 nm, thus, the mixed layer 111 is preferably formed to have a thickness of 10 to 250 nm (more preferably 120 to 180 nm).

The hole transporting layer 112 has a layer having a function of transporting holes. The hole transporting layer 112 has a function of transporting holes from the mixed layer 111 to the light-emitting layer 113 in the light-emitting element of this embodiment mode. By providing the hole transporting layer 112, a distance between the mixed layer 111 and the light-emitting layer 113 can be made larger. As a result, light can be prevented from being quenched due to the metal included in the mixed layer 111. The hole transporting layer 112 is preferably formed of a hole transporting substance, particularly, a hole transporting substance or a bipolar substance each having a hole mobility of $1 \times 10^{-6}$ cm$^2$/Vs or more (more preferably, $1 \times 10^{-6}$ to $1 \times 100$ cm$^2$/Vs). The following can be given as specific examples of a hole transporting substance which can be used for forming the hole transporting layer 112: 4,4'-bis[N-(1-naphthyl)-N-phenylamino]biphenyl (abbreviated as NPB); 4,4'-bis[N-(3-methylphenyl)-N-phenylamino]biphenyl (abbreviated as TPD); 1,3,5-tris[N,N-di(m-tolyl)amino]benzene (abbreviated as m-MTDAB); 4,4',4"-tris(N-carbazolyl)triphenylamine (abbreviated as TCTA); and the like. "Bipolar substance" denotes a substance where when mobility of an electron and mobility of a hole are compared with each other, the value of the ratio of the mobility of one carrier to the mobility of the other carrier is 100 or less, preferably 10 or less. As the bipolar substance, 2,3-bis(4-diphenylaminophenyl)quinoxaline (abbreviated as TPAQn); 2,3-bis{4-[N-(1-naphthyl)-N-phenylamino]phenyl}-dibenzo[f,h]quinoxaline (abbreviated as NPADiBzQn); and the like can be given, for example. Among bipolar substances, one bipolar substance having hole and electron mobility of $1 \times 10^{-6}$ cm$^2$/Vs or more (more preferably $1 \times 10^{-6}$ cm$^2$/Vs to $1 \times 10^0$ cm$^2$/Vs) is preferably used. It is noted that the hole transporting layer 112 preferably has a thickness of 5 to 50 nm. By employing such a thickness, increase of a driving voltage due to the thickness of the hole transporting layer 112 can be suppressed.

The light-emitting layer 113 is a layer including a light-emitting substance. Here, "light-emitting substance" denotes a substance which can emit light with excellent luminous efficiency and at a desired wavelength. The light-emitting layer 113 may be a layer made of only a light-emitting substance. However, when a concentration quenching occurs, the light-emitting layer 113 is preferably a layer in which a light-emitting substance is mixed so as to be dispersed in a layer made of a substance having an energy gap larger than that of the light-emitting substance. By including a light-emitting substance in the light-emitting layer 113 such that it is dispersed, light emission can be prevented from being quenched due to the concentration. Here, "energy gap" denotes an energy gap between a LUMO (Lowest Unoccupied Molecular Orbital) level and a HOMO (Highest Occupied Molecular Orbital) level.

There is no particular limitation on the light-emitting substance, and as long as a substance can emit light with excellent luminous efficiency and at a desired emission wavelength, the substance can be used. In order to obtain red light emission, for example, the following substances exhibiting light emission whose peak in the spectrum is in a 600 nm to 680 nm wavelength range can be used as the light-emitting substance: 4-dicyanomethylene-2-isopropyl-6-[2-(1,1,7,7-tetramethyl-9-julolidyl)ethenyl]-4H-pyran (abbreviated as DCJTI); 4-dicyanomethylene-2-methyl-6-[2-(1,1,7,7-tetramethyl-9-julolidyl)ethenyl]-4H-pyran (abbreviated as DCJT); 4-dicyanomethylene-2-tert-butyl-6-[2-(1,1,7,7-tetramethyl-9-julolidyl)ethenyl]-4H-pyran (abbreviated as DCJTB); periflanthene; 2,5-dicyano-1,4-bis[2-(10-methoxy-1,1,7,7-tetramethyl-9-julolidyl)ethenyl]benzene; or the like. In order to obtain green light emission, substances exhibiting light emission whose peak in the spectrum is in a 500 nm to 550 nm wavelength range, such as N,N'-dimethylquinacridone (abbreviated as DMQd), coumarin 6, coumarin 545T, or tris(8-quinolinolato)aluminum (abbreviated as Alq$_3$), can be used as the light-emitting substance. In order to obtain blue light emission, the following substances exhibiting light emission whose peak in the spectrum is in a 420 nm to 500 nm wavelength range, can be used as a light-emitting substance: 9,10-bis(2-naphthyl)-tert-butylanthracene (abbreviated as t-BuDNA); 9,9'-bianthryl; 9,10-diphenylanthracene (abbreviated as DPA); 9,10-bis(2-naphthyl)anthracene (abbreviated as DNA); bis(2-methyl-8-quinolinolato)-4-phenylphenolato-gallium (abbreviated as BGaq); bis(2-methyl-8-quinolinolato)-4-phenylphenolato-aluminum (abbreviated as BAlq); or the like. As mentioned above, as well as such substances which emit fluorescence, the following substance which emits phosphorescence can also be used as the light-emitting substance: bis[2-(3,5-bis(trifluoromethyl)phenyl)pyridinato-N,C$^{2'}$]iridium(III)picolinate (abbreviated as Ir(CF$_3$ppy)$_2$(pic)); bis[2-(4,6-difluorophenyl) pyridinato-N, C$^{2'}$]iridium (III)acetylacetonate (abbreviated as FIr(acac)); bis[2-(4,6-difluorophenyl)pyridinato-N,C$^{2'}$]iridium(III)picolinate (abbreviated as FIr(pic)); tris(2-phenylpyridinato-N,C$^{2'}$)iridium (abbreviated as Ir(ppy)$_3$); or the like.

In addition, there is no particular limitation on a substance which is included in the light-emitting layer 113 along with the light-emitting substance and which is used to disperse the light-emitting substance. Such a substance may be selected appropriately in terms of an energy gap or the like of a substance which is used as a light-emitting substance. For example, a metal complex such as bis[2-(2-hydroxyphenyl)pyridinato]zinc (abbreviated as Znpp$_2$) or bis[2-(2-hydroxyphenyl)benzoxazolato]zinc (abbreviated as ZnBOX), in addition to an anthracene derivative such as 9,10-di(2-naphthyl)-2-tert-butylanthracene (abbreviated as t-BuDNA); a carbazole derivative such as 4,4'-bis(N-carbazolyl)biphenyl (abbreviated as CBP); a quinoxaline derivative such as 2,3-bis(4-diphenylaminophenyl)quinoxaline (abbreviated as TPAQn) or 2,3-bis{4-[N-(1-naphthyl)-N-phenylamino]phenyl}-dibenzo[f,h]quinoxaline (abbreviated as NPADiBzQn) can be used along with a light-emitting substance.

The electron transporting layer 114 is a layer having a function of transporting electrons and has a function of transporting electrons from the second electrode 102 side to the light-emitting layer 113 in a light-emitting element of this embodiment mode. By providing the electron transporting layer 114, a distance between the second electrode 102 and the light-emitting layer 113 can be made larger. Consequently, light emission can be prevented from being quenched due to metal included in the second electrode 102. The electron transporting layer is preferably formed of an electron transporting substance and in particular, is preferably formed of an electron transporting substance or a bipolar substance each having electron mobility of $1 \times 10^{-6}$ cm$^2$/Vs or more (preferably, $1 \times 10^{-6}$ cm$^2$/VS to $1 \times 10^0$ cm$^2$/Vs). Here, "electron transporting substance" denotes a substance having electron mobility higher than hole mobility, and preferably, a substance having a value of a ratio of the electron mobility to the hole mobility (=electron mobility/hole mobility) of more than 100. The following can be given as specific examples of an electron transporting substance: 2-(4-biphenylyl)-5-(4-tert-buthylphenyl)-1,3,4-oxadiazole (abbreviated as PBD); 1,3-bis[5-(p-tert-buthylphenyl)-1,3,4-oxadiazole-2-yl]benzene (abbreviated as OXD-7); 3-(4-tert-butylphenyl)-4-phenyl-5-(4-biphenylyl)-1,2,4-triazole (abbreviated as TAZ); 3-(4-tert-butylphenyl)-4-(4-ethylphenyl)-5-(4-biphenylyl)-1,2,4-triazole (abbreviated as p-EtTAZ); bathophenanthroline (abbreviated as BPhen); bathocuproin (abbreviated as BCP); 4,4-bis(5-methylbenzoxazolyl-2-yl)stilbene (abbreviated as BzOs); and the like, in addition to a metal complex such as tris(8-quinolinolato)aluminum (abbreviated as: $A^1q_3$); tris(4-methyl-8-quinolinolato)aluminum (abbreviated as: $Almq_3$); bis(10-hydroxybenzo[h]-quinolinato)berylium (abbreviated as: $BeBq_2$); bis(2-methyl-8-quinolinolato)(4-phenylphenolato)aluminum (abbreviated as: BAlq); bis[2(2-hydroxyphenyl)benzoxazolato]zinc (abbreviated as: $Zn(BOX)_2$); and bis[2(2-hydroxyphenyl)benzothiazolato]zinc (abbreviated as: $Zn(BTZ)_2$). It is to be noted that the bipolar substance has been described above. The electron transporting layer 114 and the hole transporting layer 112 may be formed of the same bipolar substance. Note that the electron transporting layer 114 preferably has a thickness of 5 to 30 nm. By employing such a thickness, increase of driving voltage due to the thickness of the electron transporting layer 114 can be suppressed.

The electron injecting layer 115 is a layer having a function of assisting electrons to be injected from the second electrode 102 to the electron transporting layer 114. By providing the electron injecting layer 115, a difference in electron affinity between the second electrode 102 and the electron transporting layer 114 is relieved; thus, electrons are easily injected. The electron injecting layer 115 is preferably made of a substance of which electron affinity is higher than that of a substance for forming the electron transporting layer 114 and is lower than that of a substance for forming the second electrode 102. Alternatively, the electron injecting layer 115 is preferably made of a substance whose energy band curves by being provided as a thin film of about 1 nm to 2 nm thick between the electron transporting layer 114 and the second electrode 102. The following can be given as specific examples of a substance which can be used to form the electron injecting layer 115: inorganic substances such as alkali metal such as lithium (Li); alkaline earth metal such as magnesium (Mg); fluoride of alkali metal such as cesium fluoride (CsF); fluoride of alkaline earth metal such as calcium fluoride ($CaF_2$); oxide of alkali metal such as lithium oxide ($Li_2O$), sodium oxide ($Na_2O$), or potassium oxide ($K_2O$); or oxide of alkaline earth metal such as calcium oxide (CaO) or magnesium oxide (MgO). These substances are preferable because an energy band thereof curves when they are provided as a thin film. In addition to such inorganic substances, an organic substance which can be used to form the electron transporting layer 114, such as bathophenanthroline (abbreviated as BPhen); bathocuproin (abbreviated as BCP); 3-(4-tert-buthylphenyl)-4-(4-ethylphenyl)-5-(4-biphenylyl)-1,2,4-triazole (abbreviated as p-EtTAZ); or 3-(4-tert-buthylphenyl)-4-phenyl-5-(4-biphenylyl)-1,2,4-triazole (abbreviated as TAZ), can also be used as a substance for forming the electron injecting layer 115 by selecting a substance of which electron affinity is higher than that of a substance for forming the electron transporting layer 114 among these substances. In other words, the electron injecting layer 115 may be formed by selecting such a substance that electron affinity in the electron injecting layer 115 is higher than electron affinity in the electron transporting layer 114. It is to be noted that the second electrode 102 is preferably made using a substance having a low work function such as aluminum in a case of providing the electron injecting layer 115.

Figure 16:
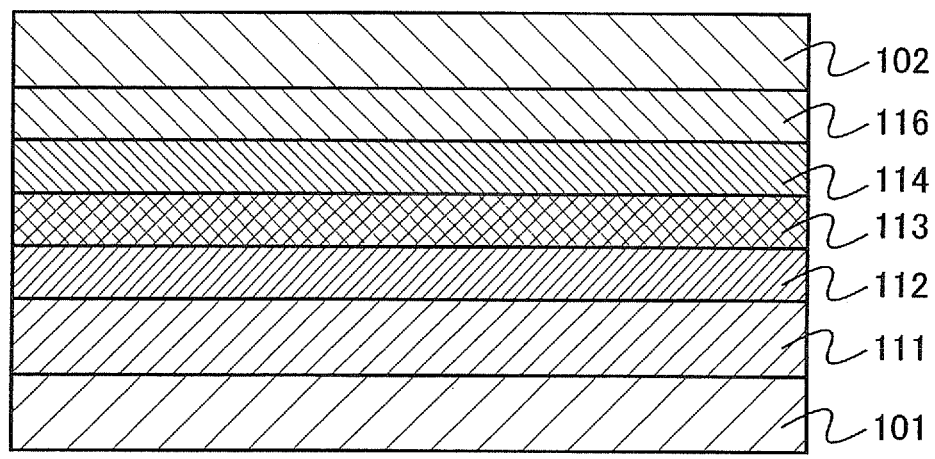
FIG. 16 shows one mode of an a light-emitting element according to an aspect of the present invention.

In the light-emitting element explained as above, each of the electron transporting substance and the hole transporting substance is preferably selected so that a ratio of mobility of one substance to mobility of the other substance is 1000 or less when mobility of an electron transporting substance used for forming the electron transporting layer 114 and mobility of the hole transporting substance included in the mixed layer 111. Thus, recombination efficiency in the light-emitting layer can be increased by selecting each substance. In this embodiment mode, the light-emitting element having the hole transporting layer 112, the electron transporting layer 114, the electron injecting layer 115, and the like, in addition to the mixed layer 111 and the light-emitting layer 113 is shown; however, a mode of the light-emitting element is not limited thereto. For example, as shown in FIG. 16, a structure having an electron-generating layer 116 or the like instead of the electron injecting layer 115 may be employed. The electron-generating layer 116 is a layer for generating electrons, and can be formed by mixing at least one substance of an electron transporting substance and a bipolar substance, with a substance which shows an electron-donating property to these substances. Here, it is preferable to use a substance having electron mobility of $1\times10^0$ $cm^2/Vs$ or more (more preferably, $1\times10^{-6}$ to $1\times10^0$ $cm^2/Vs$), especially, among the electron transporting substances and the bipolar substances. As for the electron transporting substance and the bipolar substance, the above mentioned substances can be used. In addition, as for a substance which shows an electron-donating property, a substance among alkali metals or alkaline earth metals, specifically lithium (Li), calcium (Ca), sodium (Na), potassium (K), magnesium (Mg), or the like can be used. Moreover, alkali metal oxide, alkaline earth metal oxide, alkali metal nitride, alkaline earth metal nitride, alkali metal fluoride, or alkaline earth metal fluoride, specifically at least one substance selected from lithium oxide ($Li_2O$), calcium oxide (CaO), sodium oxide ($Na_2O$), potassium oxide ($K_2O$), magnesium oxide (MgO), lithium fluoride (LiF), cesium fluoride (CsF), calcium fluoride ($CaF_2$), or the like can also be used as the substance which shows an electron-donating property.

Figure 17:
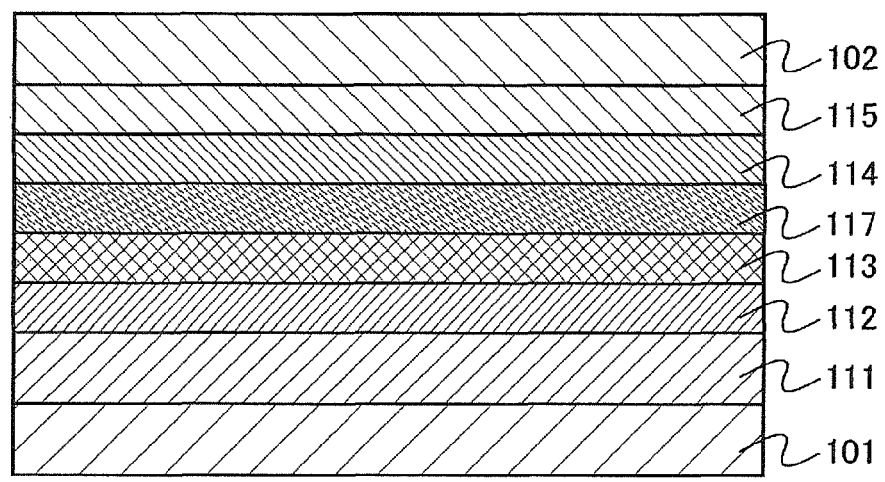
FIG. 17 shows one mode of an a light-emitting element according to an aspect of the present invention.

In addition, a hole blocking layer 117 may be provided between the light-emitting layer 113 and the electron transporting layer 114 as shown in FIG. 17. By providing the hole blocking layer 117, holes can be prevented from flowing to the second electrode 102 side after passing through the light-emitting layer 113; thus, recombination efficiency of carriers can be increased. Moreover, excitation energy generated in the light-emitting layer 113 can be prevented from translating to other layers such as the electron transporting layer 114. The hole blocking layer 117 can be formed by selecting a substance having higher ionization potential and higher excitation energy than a substance used to form the light-emitting layer 113, especially, among substances which can be used to form the electron transporting layer 114 such as BAlq, OXD-7, TAZ, and BPhen. In other words, it is acceptable as long as the hole blocking layer 117 is formed by selecting a substance so that ionization potential in the hole blocking layer 117 is comparatively higher than that in the electron transporting layer 114. In the same manner, a layer for blocking electrons from flowing to the first electrode 101 side after passing through the light-emitting layer 113 may also be provided between the light-emitting layer 113 and the hole transporting layer 112.

It is to be noted that whether the electron injecting layer 115, the electron transporting layer 114, and the hole transporting layer 112 are to be provided or not may be appropriately decided by a practitioner of the present invention, and these layers are not always necessary to be provided, for example, in a case where there is no malfunction such as quenching of light due to metal even when the hole transporting layer 112, the electron transporting layer 114, and the like are not provided, or a case where electrons are favorably injected from an electrode even when the electron injecting layer 115 is not provided.

As described above, by using a light-emitting element having the mixed layer 111 including a hole transporting substance and a metal oxide, it is easy that a distance between the first electrode 101 and the light-emitting layer 113 is adjusted so that light can be extracted efficiently or color purity of light extracted to the outside can be enhanced (in other words, an optical path length (optical length) through which emitted light goes).

The light-emitting element explained as above may be manufactured by a method for forming the second electrode 102 after sequentially stacking the mixed layer 111, the hole transporting layer 112, the light-emitting layer 113, the electron transporting layer 114, the electron injecting layer 115, and the like on the first electrode 101, or may be manufactured by a method for forming the first electrode 101 after sequentially stacking the electron injecting layer 115, the electron transporting layer 114, the light-emitting layer 113, the hole transporting layer 112, the mixed layer 111, and the like on the second electrode 102.

Embodiment Mode 2

In a light-emitting element of the present invention, an optical path length can be easily adjusted to extract light outside the light-emitting element efficiently. Thus, by using the light-emitting element described in Embodiment Mode 1 as a pixel, a light-emitting device which can conduct display operation with low power consumption can be obtained.

In this embodiment mode, a circuit configuration and a driving method of a light-emitting device having a display function are described with reference to FIGS. 2 to 6.

Figure 2:
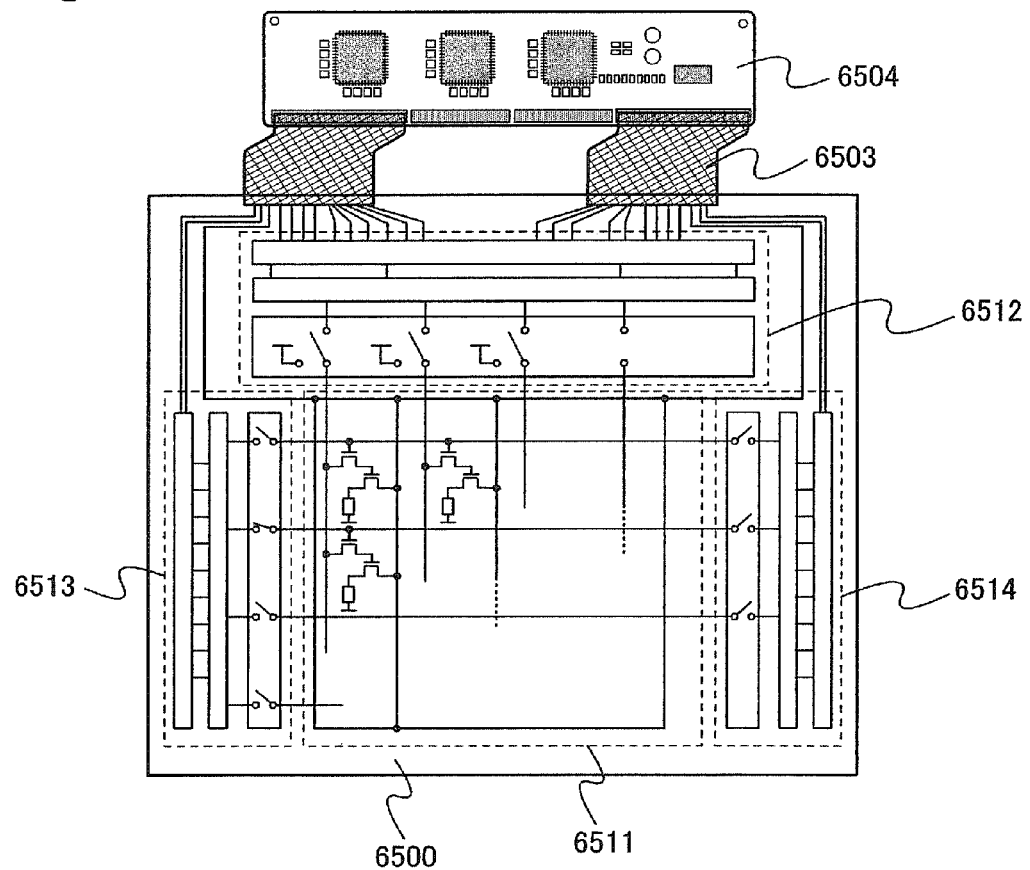
FIG. 2 shows one mode of a light-emitting device according to an aspect of the present invention.

FIG. 2 is a schematic top view of a light-emitting device to which the present invention is applied. In FIG. 2, a pixel portion 6511, a source signal line driving circuit 6512, a writing gate signal line driving circuit 6513, and an erasing gate signal line driving circuit 6514 are provided over a substrate 6500. Each of the source signal line driving circuit 6512, the writing gate signal line driving circuit 6513, and the erasing gate signal line driving circuit 6514 is connected to FPCs (flexible printed circuits) 6503 that are external input terminals through a group of wirings. Further, each of the source signal line driving circuit 6512, the writing gate signal line driving circuit 6513, and the erasing gate signal line driving circuit 6514 receives signals such as a video signal, a clock signal, a start signal, and a reset signal from the FPCs 6503. In addition, a printed wiring board (PWB) 6504 is attached to the FPCs 6503. It is not always necessary to provide the driving circuit portion over the same substrate as the pixel portion 6511 as described above. For example, the driving circuit portion may be provided outside the substrate by using a TCP (Tape Carrier Package) etc., in which an IC chip is mounted over an FPC where a wiring pattern is formed.

In the pixel portion 6511, a plurality of source signal lines extending in columns are arranged in rows. In addition, current-supply lines are arranged in rows, and a plurality of gate signal lines extending in rows are arranged in columns in the pixel portion 6511. Further, a plurality of pairs of circuits each including a light-emitting element are arranged in the pixel portion 6511.

Figure 3:
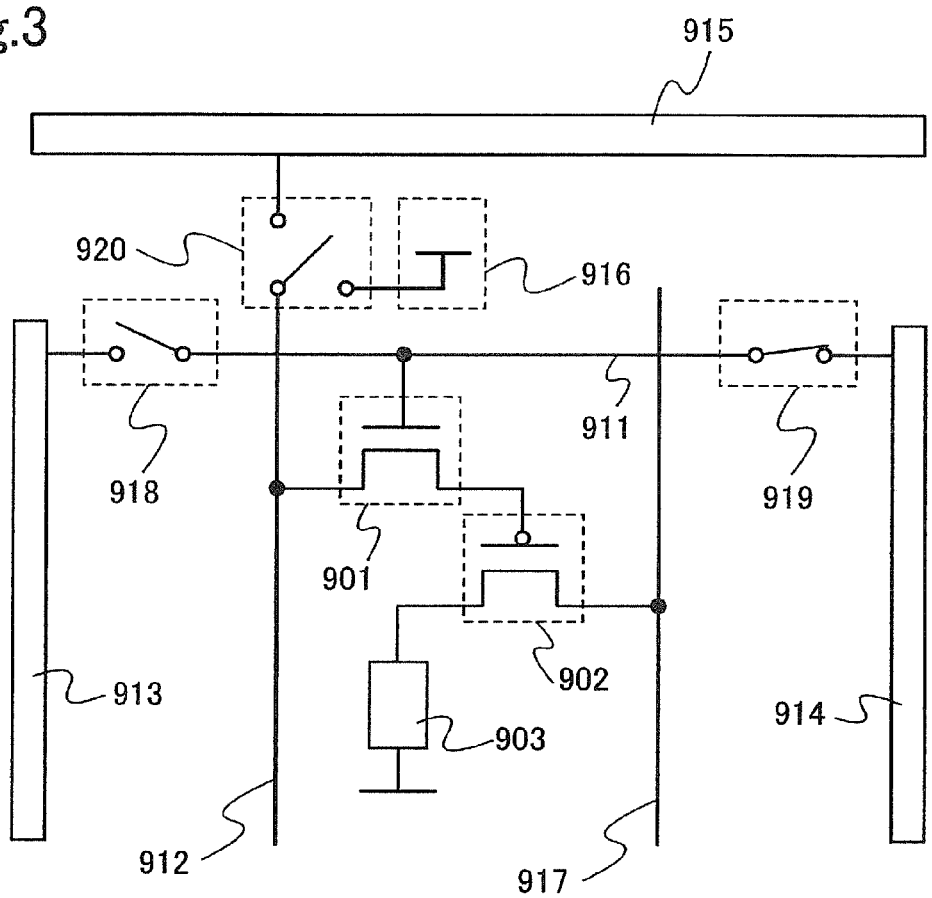
FIG. 3 shows one mode of a circuit for driving a pixel formed in a light-emitting device according to an aspect of the present invention.

FIG. 3 shows a circuit for operating one pixel. The circuit shown in FIG. 3 includes a first transistor 901, a second transistor 902, and a light-emitting element 903.

Each of the first transistor 901 and the second transistor 902 is a three-terminal element including a gate electrode, a drain region, and a source region, and includes a channel region between the drain region and the source region. Here, since a source region and a drain region are switched with each other in accordance with a structure or operating conditions of a transistor, it is difficult to identify which one is the drain region or the source region. Therefore, in this embodiment mode, regions that serve as a source or a drain are referred to as a first electrode and a second electrode of the transistor, respectively.

A gate signal line 911 and a writing gate signal line driving circuit 913 are provided so as to be electrically connected or disconnected by a switch 918. The gate signal line 911 and an erasing gate signal line driving circuit 914 are provided so as to be electrically connected or disconnected by a switch 919. Further, a source signal line 912 is provided so as to be electrically connected to any of a source signal line driving circuit 915 and a power source 916 by a switch 920. A gate of the first transistor 901 is electrically connected to the gate signal line 911, a first electrode of the first transistor is electrically connected to the source signal line 912, and a second electrode is electrically connected to a gate electrode of the second transistor 902. A first electrode of the second transistor 902 is electrically connected to a current-supply line 917 and a second electrode is electrically connected to one electrode included in the light-emitting element 903. It is to be noted that the switch 918 may be included in the writing gate signal line driving circuit 913, the switch 919 may be included in the erasing gate signal line driving circuit 914, and the switch 920 may be included in the source signal line driving circuit 915.

Figure 4:
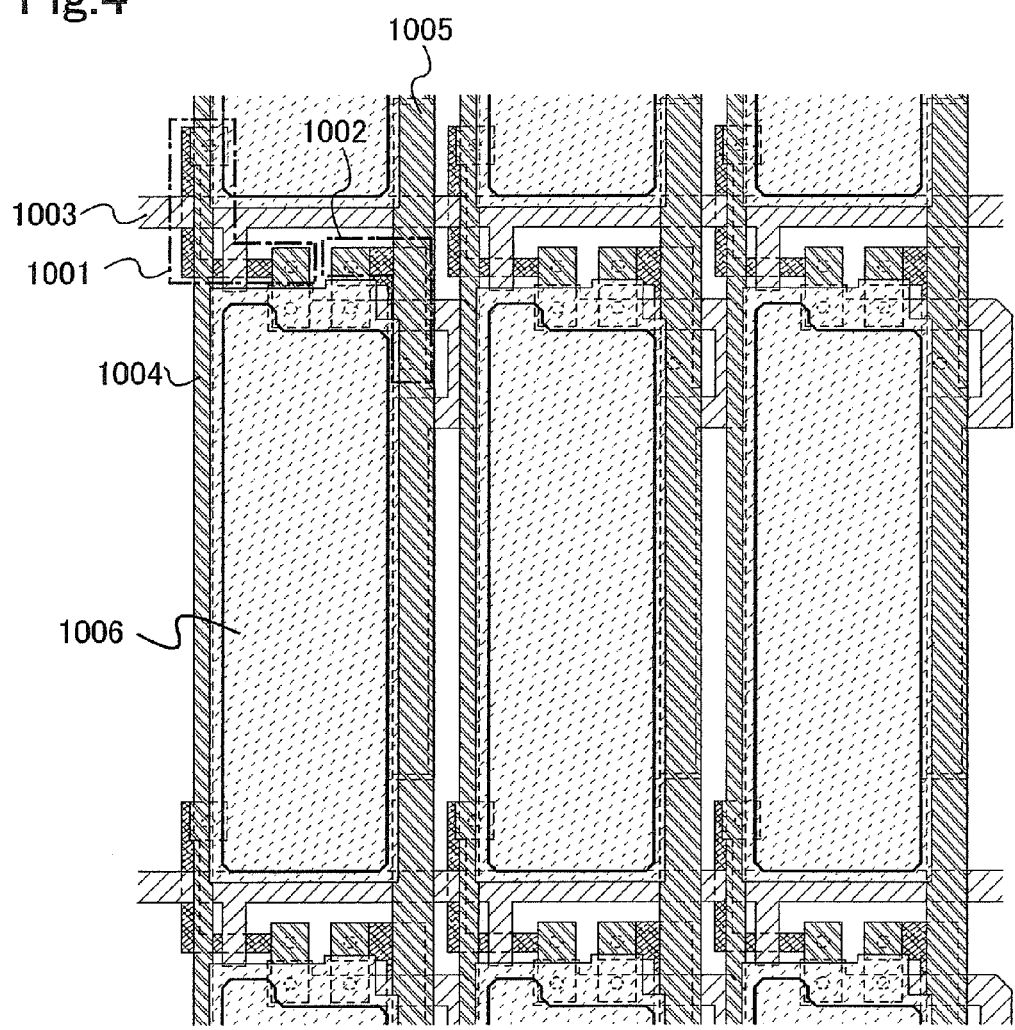
FIG. 4 shows one mode of a pixel portion included in a light-emitting device according to an aspect of the present invention.

In addition, arrangement of a transistor, a light-emitting element, and the like in a pixel portion is not particularly limited. For example, arrangement shown in a top view of FIG. 4 can be employed. In FIG. 4, a first electrode of a first transistor 1001 is connected to a source signal line 1004 and a second electrode is connected to a gate electrode of a second transistor 1002. Moreover, a first electrode of the second transistor 1002 is connected to a current-supply line 1005 and a second electrode is connected to an electrode 1006 of a light-emitting element. A part of a gate signal line 1003 serves as a gate electrode of the first transistor 1001.

Next, a driving method will be explained. FIG. 5 is a diagram illustrating an operation per frame in accordance with passage of time. In FIG. 5, the horizontal direction indicates passage of time, and the vertical direction indicates the number of scanning stages of gate signal lines.

When a light-emitting device of the present invention is used to display images, a rewrite operation and a display operation for a screen are repeated in a display period. Although the number of rewrites is not particularly limited, it is preferable that the number of rewrites be at least about 60 times per second so as not to make a viewer notice flickers. Here, a period for which a rewrite operation and a display operation are performed for a screen (one frame) is referred to as one frame period.

As shown in FIG. 5, one frame period is divided into four sub-frames 501, 502, 503, and 504 including writing periods 501a, 502a, 503a, and 504a and retention periods 501b, 502b, 503b, and 504b, respectively. A light-emitting element to which a signal for emitting light is given is made to be in an emitting state in a retention period. The ratio of the length of the retention period in each sub-frame is, the first sub-frame

501: the second sub-frame 502: the third sub-frame 503: the fourth sub-frame 504=$2^3:2^2:2^1:2^0$=8:4:2:1. This makes 4-bit gradation possible. However, the number of bits and the number of gradations are not limited to the ones described here. For example, eight sub-frames may be provided so as to perform 8-bit gradation.

An operation in one frame period will be explained. First, in the sub-frame 501, writing operations are sequentially performed for a first row to a last row. Consequently, the start time of writing period is different depending on the rows. In rows for which the writing period 501*a* is completed, the state is shifted sequentially into the retention period 501*b*. In the retention periods, a light-emitting element to which a signal for emitting light is given is made to be in an emitting state. In addition, in rows for which the retention period 501*b* is completed, the state is shifted sequentially into the next sub-frame 502, and writing operations are sequentially performed for the first row to the last row as in the case of the sub-frame 501. Such operations as described above are repeated and finish up to the retention period 504*b* of the sub-frame 504. When the operation in the sub-frame 504 is completed, the next frame begins. Thus, a total of the time for which light is emitted in each sub-frame is emission time for each light-emitting element in one frame. By varying this emission time for each light-emitting element to have various combinations in one pixel, various display colors with different luminosity and chromaticity can be made.

As in the sub-frame 504, when forcible termination of a retention period of a row for which writing has been already completed and which is moved into the retention period is required before writing for the last row is completed, it is preferable that an erasing period 504*c* be provided after the retention period 504*b* and a row be controlled so as to be in a non-emitting state forcibly. Then, the row forcibly made to be in the non-emitting state is kept in the non-emitting state for a certain period (this period is referred to as a non-emission period 504*d*). Then, immediately after the writing period of the last row is completed, the state is shifted sequentially into the writing period (or the next frame), starting from the first row. This makes it possible to prevent the writing period of the sub-frame 504 from overlapping with the writing period of the next sub-frame.

Although the sub-frames 501 to 504 are arranged in the order from the longest retention period to the shortest in this embodiment mode, the arrangement as in this embodiment mode is not always necessary. For example, the sub-frames 501 to 504 may be arranged in the order from the shortest retention period to the longest, or may be arranged in random order. In addition, the sub-frames may be further divided into a plurality of frames. In other words, scanning of the gate signal lines may be performed plural times while giving the same video signal.

Now, an operation of the circuit shown in FIG. 3 in a writing period and an erasing period will be explained.

First, an operation in a writing period will be explained. In the writing period, the gate signal line 911 in n-th row (n is a natural number) is electrically connected to the writing gate signal line driving circuit 913 through the switch 918, and disconnected to the erasing gate signal line driving circuit 914. In addition, the source signal line 912 is electrically connected to the source signal line driving circuit 915 through the switch 920. Here, a signal is inputted into the gate of the first transistor 901 connected to the gate signal line 911 in n-th row (n is a natural number) to turn on the first transistor 901. Then, at this time, video signals are inputted at the same time into the source signal lines 912 in the first to the last columns. It is to be noted that the video signals inputted from the source signal lines 912 in the respective columns are independent of each other. The video signal inputted from the source signal line 912 is inputted into the gate electrode of the second transistor 902 through the first transistor 901 connected to each of the source signal lines 912. At this time, whether the light-emitting element 903 emits light or not is determined depending on the signal imputed to the second transistor 902. For example, when the second transistor 902 is a p-channel transistor, the light-emitting element 903 emits light by inputting a Low Level signal to the gate electrode of the second transistor 902. On the other hand, when the second transistor 902 is an n-channel transistor, the light-emitting element 903 emits light by inputting a High Level signal to the gate electrode of the second transistor 902.

Next, an operation in an erasing period will be explained. In the erasing period, the gate signal line 911 in n-th row (n is a natural number) is electrically connected to the erasing gate signal line driving circuit 914 through the switch 919 and disconnected to the wiring gate signal line driving circuit 913. In addition, the source signal line 912 is electrically connected to the power source 916 through the switch 920. Here, a signal is inputted into the gate of the first transistor 901 connected to the gate signal line 911 in n-th row to turn on the first transistor 901. Then, at this moment, erasing signals are inputted at the same time into the source signal lines 912 in the first to last columns. The erasing signal inputted from the source signal lines 912 is inputted into the gate electrode of the second transistor 902 through the first transistor 901 connected to each of the source signal lines. At this moment, current supply from the current-supply line 917 to the light-emitting element 903 is stopped by the signal inputted into the second transistor 902. Then, the light-emitting element 903 is forcibly made to emit no light. For example, when the second transistor 902 is a p-channel transistor, the light-emitting element 903 emits no light by inputting a High Level signal to the gate electrode of the second transistor 902. On the other hand, when the second transistor 902 is an n-channel transistor, the light-emitting element 903 emits no light by inputting a Low Level signal to the gate electrode of the second transistor 902.

It is to be noted that, as for n-th row (n is a natural number), signals for erasing are inputted by the operation as described above in an erasing period. However, as described above, another row (referred to as m-th row (m is a natural number)) may be in a writing period while the n-th row is in an erasing period. In such a case, it is necessary to input a signal for erasing into the n-th row and input a signal for writing into the m-th row by using a source signal line in the same column. Therefore, an operation that will be explained below is preferable.

Immediately after the light-emitting element 903 in the n-th row is made to emit no light by the operation in the erasing period as explained above, the gate signal line 911 and the erasing gate signal line driving circuit 914 are made to be disconnected to each other, and the switch 920 is switched to connect the source signal line 912 and the source signal line driving circuit 915. Then, in addition to connecting the source signal line 912 to the source signal line driving circuit 915, the gate signal line 911 is connected to the writing gate signal line driving circuit 913. Then, a signal is inputted selectively into the gate signal line 911 in the m-th row from the writing gate signal line driving circuit 913 to turn on the first transistor 901, and signals for writing are inputted into the source signal lines 912 in the first to last columns from the source signal line driving circuit 915. This signal makes the light-emitting element 903 in the m-th row be in an emitting or non-emitting state.

Immediately after the writing period for the m-th row is completed as described above, an erasing period for a (n+1)-th row is started. For that purpose, the gate signal line 911 and the writing gate signal line driving circuit 913 are made to be disconnected to each other, and the switch 920 is switched to connect the source signal line 912 and the power source 916. Further, the gate signal line 911 is made to be disconnected to the writing gate signal line driving circuit 913, and to be connected to the erasing gate signal line driving circuit 914. Then, a signal is inputted selectively into the gate signal line in the (n+1)-th row from the erasing gate signal line driving circuit 914 to turn on the first transistor 901, and an erasing signal is inputted from the power source 916. Immediately after the erasing period for the (n+1)-th row is thus completed, a writing period for the (m+1)-th row is started. Then, an erasing period and a writing period may be repeated in the same way until an erasing period for the last row is completed.

Although a mode in which the writing period for the m-th row is provided between the erasing period for the n-th row and the erasing period for the (n+1)-th row is explained in this embodiment mode, the present invention is not limited thereto. The writing period for the m-th row may be provided between an erasing period for a (n−1)-th row and an erasing period for the n-th row as well.

In addition, in this embodiment mode, an operation is repeated, in which the erasing gate signal line driving circuit 914 and one gate signal line are made to be disconnected to each other as well as the writing gate signal line driving circuit 913 and another gate signal line are made to be connected to each other when the non-emission period 504*d* is provided as in the sub-frame 504. This type of operation may also be performed in a frame in which a non-emission period is not particularly provided.

Embodiment Mode 3

One mode of a light-emitting device including a light-emitting element of the present invention will be described with reference to cross-sectional views in FIGS. 6A to 6C.

Figure 6A:
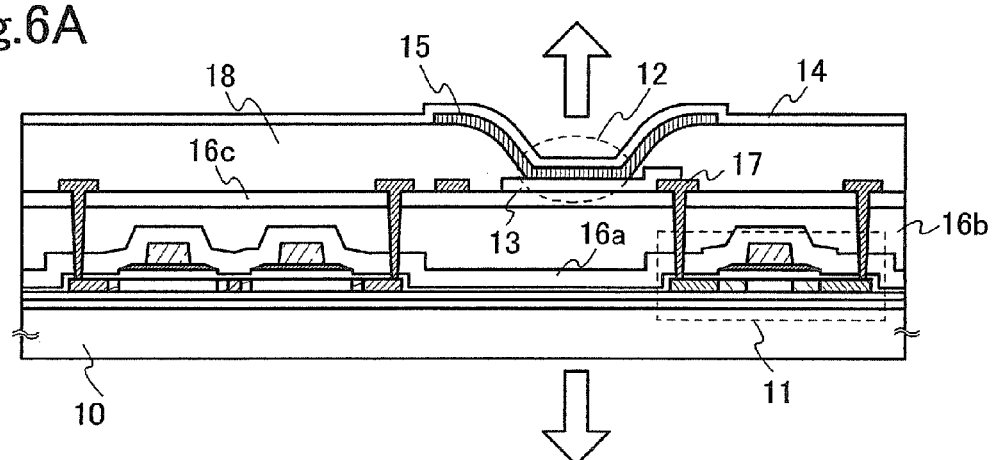
FIGS. 6A to 6C each show one mode of a cross section of a light-emitting device according to an aspect of the present invention.
Figure 6B:
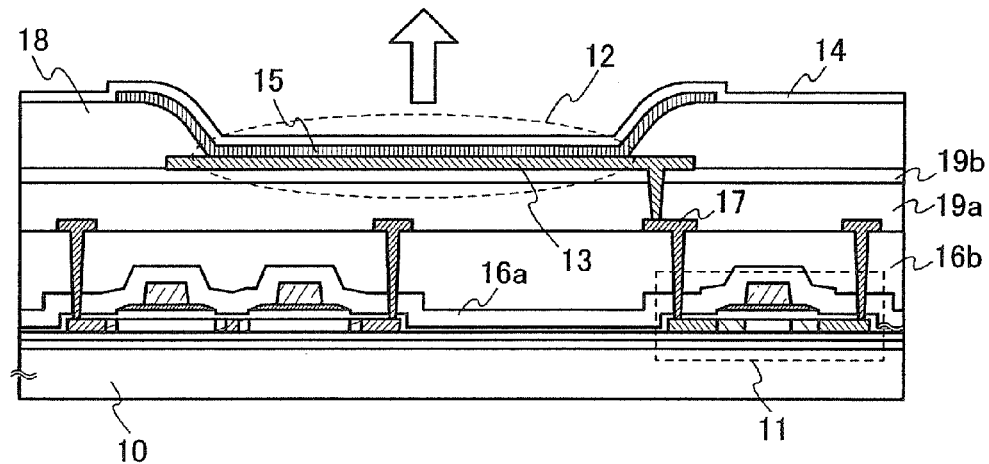
Figure 6C:
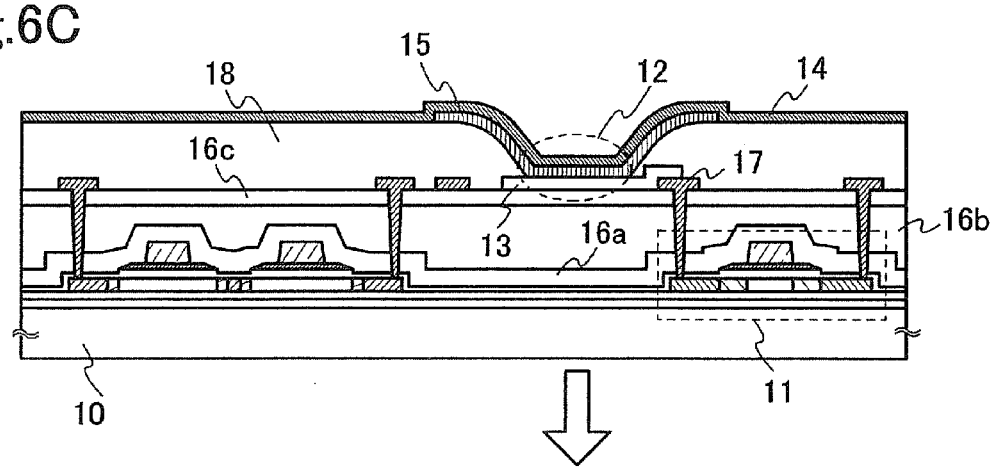

In each of FIGS. 6A to 6C, a box-shaped portion surrounded by a dotted line is a transistor 11 provided for driving a light-emitting element 12 of the present invention. The light-emitting element 12 is a light-emitting element of the present invention described in Embodiment Mode 1. A drain of the transistor 11 and the first electrode 13 are electrically connected to each other by a wiring 17 running through a first interlayer insulating film 16 (16*a*, 16*b*, and 16*c*). In addition, the light-emitting element 12 is separated by a partition layer 18 from another light-emitting element that is provided adjacently. A light-emitting device having such a structure of the present invention is provided over a substrate 10 in this embodiment mode.

It is to be noted that the transistor 11 shown in each of FIGS. 6A to 6C is a top-gate TFT in which a gate electrode is provided on an opposite side of a substrate with a semiconductor layer as a center. However, a structure of the transistor 11 is not particularly limited. For example, a bottom-gate TFT may be used. In the case of a bottom-gate TFT, a TFT where a protective film is formed over a semiconductor layer that forms a channel (a channel-protected TFT) may be employed, or a TFT where a part of a semiconductor layer that forms a channel is depressed (a channel-etched f) may be employed.

In addition, a semiconductor layer which forms the transistor 11 may be either crystalline or amorphous, or alternatively, semi-amorphous or the like.

The following will describe a semi-amorphous semiconductor. The semi-amorphous semiconductor is a semiconductor that has an intermediate structure between amorphous and crystalline (including single-crystal or polycrystalline) structures and has a third state that is stable in terms of free energy, which includes a crystalline region that has short range order and lattice distortion. Further, a crystal grain of 0.5 to 20 nm is included in at least a region in a film of the semi-amorphous semiconductor. Raman spectrum is shifted to a wave number side lower than 520 cm$^{-1}$. The diffraction peaks of (111) and (220), which are believed to be derived from silicon crystal lattice, are observed by the X-ray diffraction. The semi-amorphous semiconductor contains hydrogen or halogen of at least 1 atomic % or more for terminating dangling bonds. The semi-amorphous semiconductor is also referred to as a so-called microcrystalline semiconductor. A microcrystalline semiconductor can be formed by glow discharge decomposition (using plasma CVD) with a gas containing silicon selected from $SiH_4$, $Si_2H_6$, $SiH_2Cl_2$, $SiHCl_3$, $SiCl_4$, or $SiF_4$. Such a gas containing silicon also be diluted with $H_2$, or a mixture of $H_2$ and one or more of rare gas elements of He, Ar, Kr, and Ne. The dilution ratio is set to be in a range of 1:2 to 1:1000. The pressure is set to be approximately in the range of 0.1 to 133 Pa. The power frequency is set to be 1 to 120 MHz, preferably, 13 to 60 MHz. The substrate heating temperature may be set to be 300° C. or lower, more preferably, 100 to 250° C. As for impurity elements contained in the film, each concentration of impurities for atmospheric constituents such as oxygen, nitrogen and carbon is preferably set to be $1\times10^{20}/cm^3$ or lower. In particular, the oxygen concentration is set to be $5\times10^{19}/cm^3$ or less, preferably, $1\times10^{19}/cm^3$ or less.

Further, as specific examples of a crystalline semiconductor layer, a semiconductor layer formed of single-crystal or polycrystalline silicon, or silicon-germanium is given, which may be formed by laser crystallization or may be formed by crystallization with a solid-phase growth method using an element such as nickel.

In the case of using an amorphous substance, for example, amorphous silicon to form the semiconductor layer, it is preferable that the light-emitting device have a circuit in which the transistor 11 and other transistors (transistors constituting a circuit for driving the light-emitting element) are all n-channel transistors. Other than that case, the light-emitting device may have a circuit including one of an n-channel transistor and a p-channel transistor or may have a circuit including both of an n-channel transistor and a p-channel transistor.

Further, the first interlayer insulating film 16 may be multilayered as shown in FIGS. 6A to 6C, or may be a single layer. It is to be noted that the first interlayer insulating film 16*a* contains an inorganic substance such as silicon oxide or silicon nitride, and the first interlayer insulating film 16*b* contains acrylic, siloxane (siloxane is a compound which its skeleton structure is structured by a bond between silicon (Si) and oxygen (O), and has an organic group such as a fluoro group or an alkyl group as a substituent), or a substance such as silicon oxide that can be formed by being coated. In addition, the first interlayer insulating film 16*c* includes a silicon nitride film containing argon (Ar). The substances constituting each of the layers are not particularly limited; therefore, substances other than the substances mentioned here may also be used. Moreover, a layer containing a substance other than these substances may also be combined. In this way, both of an inorganic substance and an organic substance, or one of an inorganic substance and an organic substance may be used to form the first interlayer insulating film 16.

As for the partition layer 18, it is preferable that an edge portion have a shape varying continuously in curvature radius. In addition, acrylic, siloxane, resist, silicon oxide or the like is used to form the partition layer 18. One or both of an inorganic substance and an organic substance may be used to form the partition layer 18.

In each of FIGS. 6A and 6C, only the first interlayer insulating film 16 is provided between the transistor 11 and the light-emitting element 12. However, as shown in FIG. 6B, a second interlayer insulating film 19 (19a and 19b) may be provided in addition to the first interlayer insulating film 16 (16a and 16b). In the light-emitting device shown in FIG. 6B, the first electrode 13 is connected to the wiring 17, by passing through the second interlayer insulating film 19.

The second interlayer insulating film 19 may be multilayered or a single layer as in the case of the first interlayer insulating film 16. The second interlayer insulating film 19a contains a substance such as acrylic, siloxane, or silicon oxide or the like that can be formed by being coated. In addition, the second interlayer insulating film 19b includes a silicon nitride film containing argon (Ar). The substances constituting the respective layers are not particularly limited; therefore, substances other than the substances mentioned here may also be used. Moreover, a layer containing a substance other than these substances may also be combined. In this way, both of an inorganic substance and an organic substance, or a film made of one of an inorganic substance and an organic substance may be used to form the second interlayer insulating film 19.

In the light-emitting element 12, in a case where both of the first electrode and the second electrode are formed by using a light transmitting substance, emitted light can be extracted from both of the first electrode 13 side and the second electrode 14 side as indicated by outline arrows of FIG. 6A. In the case where only the second electrode 14 is formed by using a light transmitting substance, emitted light can be extracted from only the second electrode 14 side as indicated by an outline arrow of FIG. 6B. In this case, it is preferable that the first electrode 13 be formed by using a highly reflective material, or a film composed of a highly reflective material (a reflective film) be provided below the first electrode 13. Further, in the case where only the first electrode 13 is formed by using a light transmitting substance, emitted light can be extracted from only the first electrode 13 side as indicated by an outline arrow of FIG. 6C. In this case, it is preferable that the second electrode 14 be formed by using a highly reflective material, or a reflective film be provided above the second electrode 14.

In addition, a layer 15 may be stacked so that the light-emitting element 12 is operated when a voltage is applied so as to make the potential of the second electrode 14 higher than that of the first electrode 13. Alternatively, the layer 15 may be stacked so that the light-emitting element 12 is operated when a voltage is applied so as to make the potential of the second electrode 14 lower than that of the first electrode 13. The transistor 11 is an n-channel transistor in the former case, and the transistor 11 is a p-channel transistor in the latter case.

Figure 7:
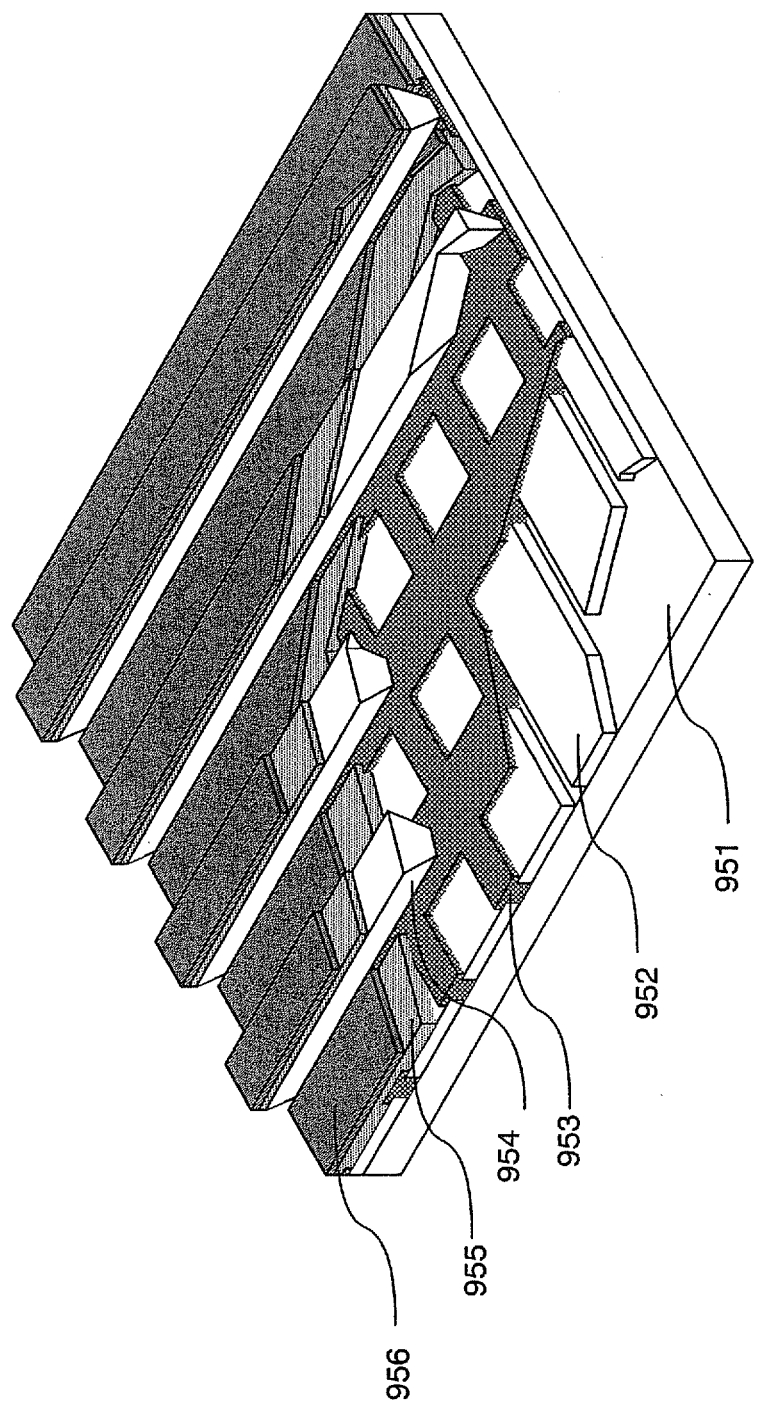
FIG. 7 shows one mode of a light-emitting device according to an aspect of the present invention.

In this embodiment mode, an active type light-emitting device that controls driving of a light-emitting element by a transistor has been described as in the above. However, the light-emitting element may also be a passive type that drives a light-emitting element without particularly providing an element for driving such as a transistor. FIG. 7 is a perspective view of a passive type light-emitting device manufactured by applying the present invention. The light-emitting device in FIG. 7 includes a light-emitting element of the present invention having a structure where a layer 955 including a light-emitting layer and the like is provided between an electrode 952 and an electrode 956, over a substrate 951. End portions of the electrode 952 are covered with an insulating layer 953.

Further, a partition layer 954 is provided over the insulating layer 953. Side walls of the partition layer 954 are sloped so that a distance between one side wall and the other becomes shorter towards a substrate surface. In other words, a cross-section in a short side direction of the partition layer 954 has a trapezoidal shape, for which a bottom side (a side in the same direction as a plane direction of the insulating layer 953, and is in contact with the insulating layer 953) is shorter than an upper side (a side in the same direction as the plane direction of the insulating layer 953, and is not in contact with the insulating layer 953). In this manner, by providing the partition layer 954, malfunctioning of a light-emitting element due to electrostatic discharge and the like can be prevented. Also, in a passive type light-emitting device, by including a light-emitting element of the present invention that operates with low driving voltage, driving with low power consumption is possible.

Embodiment Mode 4

Since a light-emitting device using a light-emitting element of the present invention as a pixel or a light source can be operated with low power consumption, an electronic device that can be operated with low power consumption can be obtained by using such a light-emitting device for a display portion.

Figure 8A:
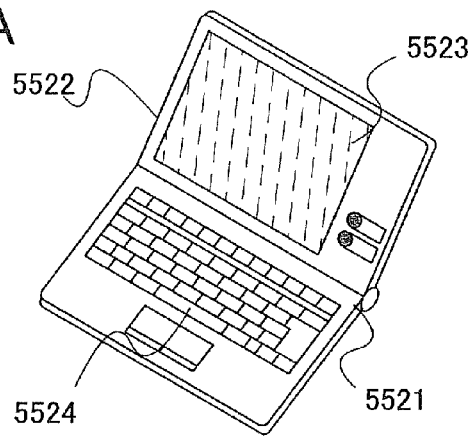
FIGS. 8A to 8C each show one mode of an electronic device to which the present invention is applied.
Figure 8B:
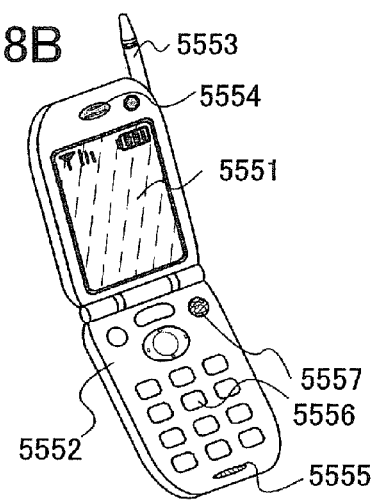
Figure 8C:
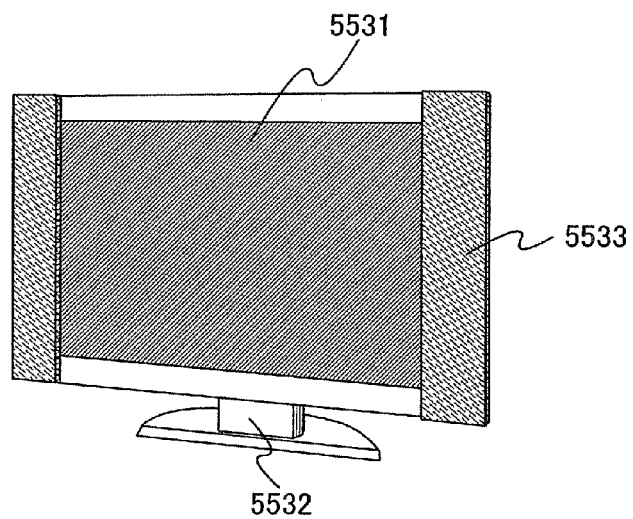

An example of an electronic device mounted with a light-emitting device to which the present invention is applied, is shown in each of FIGS. 8A to 8C.

FIG. 8A is a personal computer manufactured by applying the present invention, which includes a main body 5521, a housing 5522, a display portion 5523, a keyboard 5524, and the like. The personal computer which can be operated with low power consumption can be completed by incorporating, in the display portion, a light-emitting device (for example, a light-emitting device including a structure such as those described in Embodiment Modes 3 and 4) including the light-emitting element of the present invention as described in Embodiment Mode 1 as a pixel. Further, the personal computer can also be completed by incorporating as a backlight a light-emitting device using the light-emitting element of the present invention as a light source. Specifically, a lighting device in which a liquid crystal device 5512 and a light-emitting device 5513 are fit into a housing 5511 and a housing 5514, may be incorporated as a display portion as shown in FIG. 9. Note that in FIG. 9, an external input terminal 5515 is attached to the liquid crystal device 5512, and an external input terminal 5516 is attached to the light-emitting device 5513.

FIG. 8B is a telephone set manufactured by applying the present invention, which includes a main body 5552, a display portion 5551, an audio output portion 5554, an audio input portion 5555, operation switches 5556 and 5557, an antenna 5553, and the like. The telephone set which can be operated with low power consumption can be completed by incorporating a light-emitting device including the light-emitting element of the present invention as the display portion.

FIG. 8C is a television set manufactured by applying the present invention, which includes a display portion 5531, a housing 5532, a speaker 5533, and the like. The television set which can be operated with low power consumption can be completed by incorporating a light-emitting device including the light-emitting element of the present invention as the display portion.

As in the above, the light-emitting device of the present invention is extremely suitable to be used in display portions for various electronic devices. Note that the electronic device is not limited to those mentioned in this embodiment mode, and may be other electronic devices as a navigation device and the like.

EXAMPLE 1

One example of the present invention is described with reference to FIG. 10.

In Example 1, twenty one light-emitting elements which had different thickness of mixed layers in which a hole transporting substance and a metal oxide were mixed, and in which each of the substances had a different volume percentage were manufactured, and the current efficiency (cd/A) and power efficiency (lm/W) of each light-emitting element were measured. Thicknesses of mixed layers and volume percentages of metal oxides with respect to volumes of the mixed layers (mixing rate) [vol %] in the respective light-emitting elements are shown in Table 1. In this example, NPB was used as the hole transporting substance and molybdenum oxide was used as the metal oxide.

TABLE 1

| Light-emitting element | Thickness (nm) | Volume percentage (vol %) |
|---|---|---|
| (1) | 60 | 7 |
| (2) | 90 | 7 |
| (3) | 120 | 7 |
| (4) | 150 | 7 |
| (5) | 180 | 7 |
| (6) | 210 | 7 |
| (7) | 240 | 7 |
| (8) | 60 | 10 |
| (9) | 90 | 10 |
| (10) | 120 | 10 |
| (11) | 150 | 10 |
| (12) | 180 | 10 |
| (13) | 210 | 10 |
| (14) | 240 | 10 |
| (15) | 60 | 13 |
| (16) | 90 | 13 |
| (17) | 120 | 13 |
| (18) | 150 | 13 |
| (19) | 180 | 13 |
| (20) | 210 | 13 |
| (21) | 240 | 13 |

First, a manufacturing method of a light-emitting element will be described. The respective light-emitting elements have the same structure except for the thickness of the mixed layer and the volume percentage of the metal oxide with respect to the volume of the mixed layer.

Figure 10:
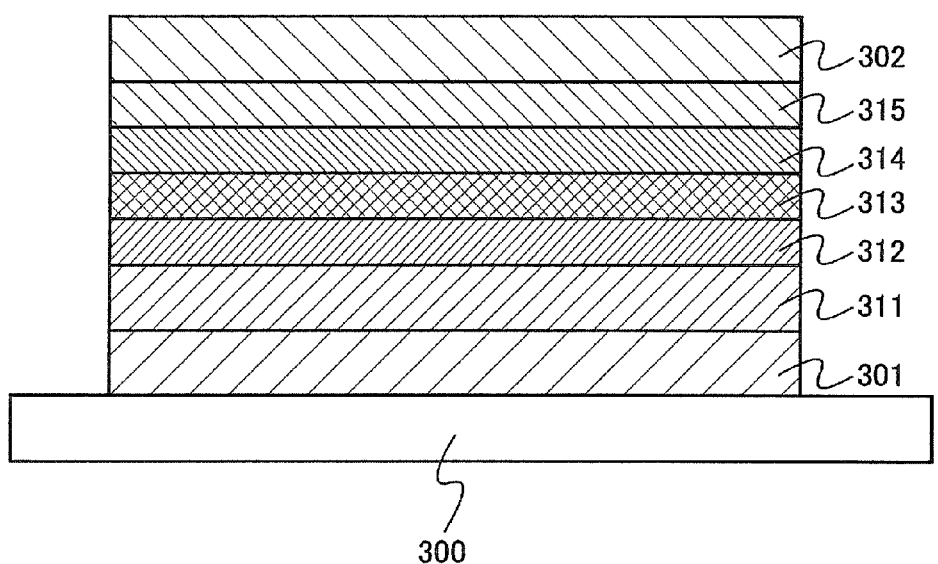
FIG. 10 shows one example of a light-emitting element according to an aspect of the present invention.

As shown in FIG. 10, a first electrode 301 was formed using indium tin oxide to have a thickness of 110 nm over a substrate 300. At this time, a sputtering method was adopted to form the first electrode 301.

Then, a first layer 311 including NPB and molybdenum oxide was formed over the first electrode 301 by a co-evaporation method. Note that molybdenum trioxide; especially, of molybdenum oxides was used to form the first layer 311 as an evaporation material. The thicknesses of the first layers 311 in the respective light-emitting elements were set at values shown in Table 1. The volume percentages of molybdenum oxides were also set at values shown in Table 1. It is noted that "co-evaporation" means an evaporation process in which raw materials are evaporated from plural evaporation sources provided in one treatment chamber and the evaporated raw materials are deposited on objects to be processed to form layers in which plural substances are mixed.

Then, a second layer 312 was formed using NPB over the first layer 311 by an evaporation method. A thickness of the second layer 312 was set 10 nm. The second layer 312 served as a hole transporting layer, when each of the light-emitting elements was driven.

Next, a third layer 313 including $Alq_3$ and coumarin 6 was formed over the second layer 312 by a co-evaporation method. A thickness of the third layer 313 was set 40 nm. In addition, a weight ratio of $Alq_3$ to coumarin 6 was set at 1:0.01 (a molar ratio was 1:0.013)(=$Alq_3$ to coumarin 6). Thus, coumarin 6 was dispersed in the layer formed from $Alq_3$. The thusly formed third layer 313 served as a light-emitting layer when each of the light-emitting elements was driven.

A fourth layer 314 was formed using $Alq_3$ over the third layer 313 by an evaporation method. A thickness of the fourth layer 314 was set at 30 nm. The fourth layer 314 served as an electron transporting layer, when each of the light-emitting elements was driven.

A fifth layer 315 was formed using lithium fluoride over the fourth layer 314 by an evaporation method. A thickness of the fifth layer 315 was set at 1 nm. The fifth layer 315 served as an electron injecting layer, when each of the light-emitting elements was driven.

Then, a second electrode 302 was formed using aluminum over the fifth layer 315 by an evaporation method to have a thickness of 200 nm.

Figure 11:
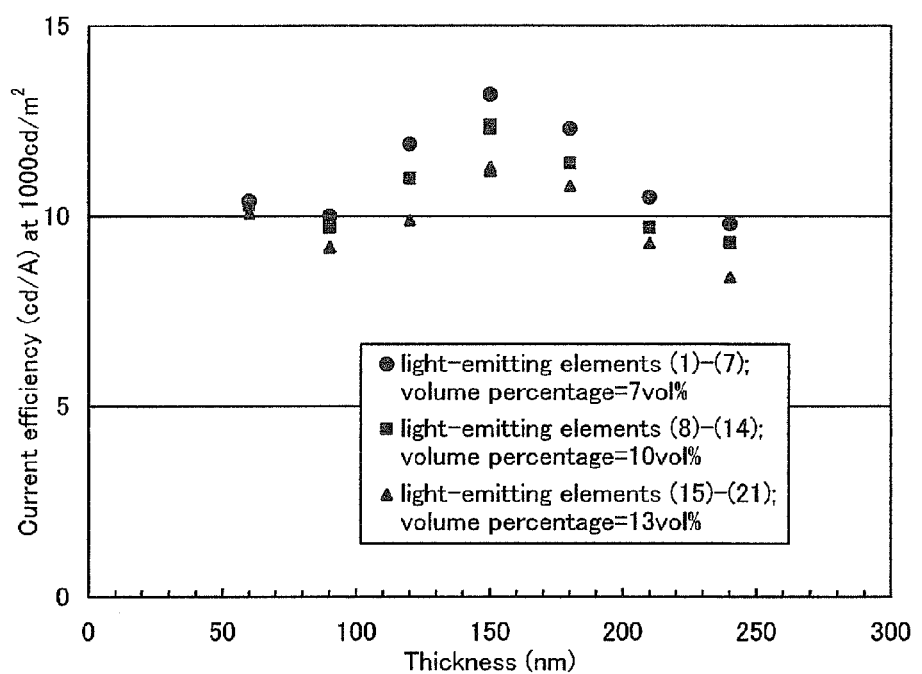
FIG. 11 is a graph showing variation of current efficiency with respect to a thickness of a mixed layer (first layer 311)
Figure 12:
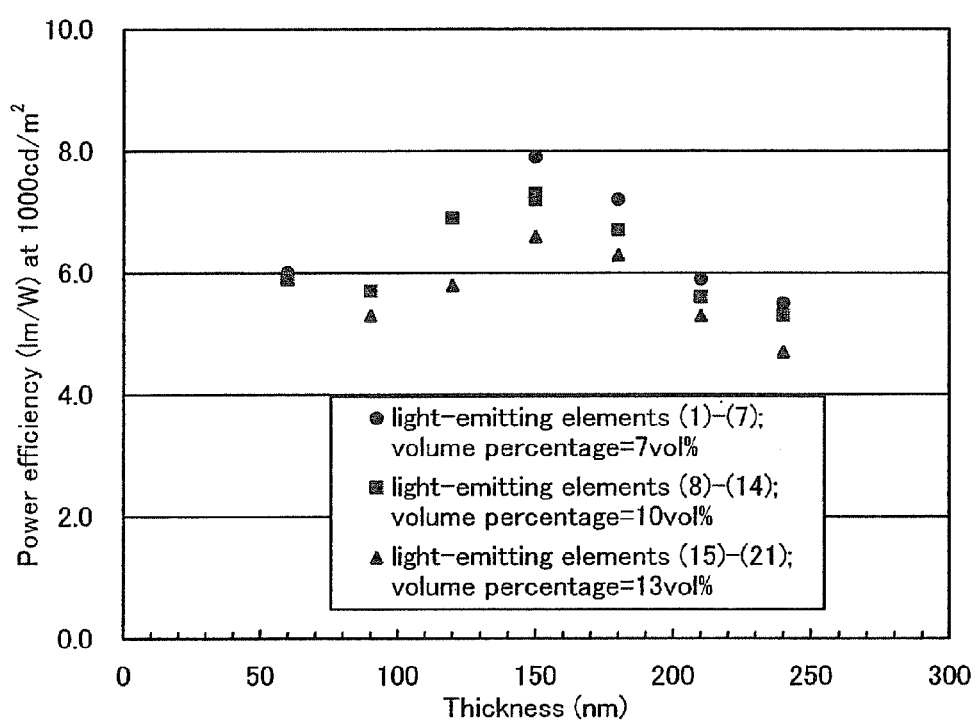
FIG. 12 is a graph showing variation of power efficiency with respect to a thickness of a mixed layer (first layer 311)

As described above, voltage was applied to each of the manufactured light-emitting elements such that a potential of the first electrode 301 became higher than that of the second electrode 302, and operation properties of the light-emitting elements were measured. The measurement results are shown in FIGS. 11 to 14. FIG. 11 is a graph in which after the light-emitting elements (1) to (21) were made to emit light at 1000 $cd/m^2$ and current efficiencies were measured, the current efficiencies [cd/A] (vertical axis) at 1000 $cd/m^2$ with respect to thicknesses of the first layers 311 [nm] (horizontal axis) were plotted. FIG. 12 is a graph in which after the light-emitting elements (1) to (21) were made to emit light at 1000 $cd/m^2$ and power efficiencies were measured, the power efficiencies [lm/W] (vertical axis) at 1000 $cd/m^2$ with respect to thicknesses of the first layers 311 [nm] (horizontal axis) were plotted. Note that in the light-emitting elements manufactured in Example 1, green emission derived from coumarin 6 was obtained.

In FIGS. 11 and 12, the round black marks which are plotted show results for the light-emitting elements (1) to (7), in which the volume percentage of molybdenum oxide in the first layer 311 is 7 vol %, the square black marks which are plotted show results for the light-emitting elements (8) to (14), in which the volume percentage of molybdenum oxide in the first layer 311 is 10 vol %, and the triangular black marks which are plotted show results for the light-emitting elements (15) to (21), in which the volume percentage of molybdenum oxide in the first layer 311 is 13 vol %.

As shown in FIGS. 11 and 12, the current efficiencies and power efficiencies are highest when the first layers 311 are 120 to 180 nm thick (in other words, when the distance from the third layer 313 serving as a light-emitting layer to the first electrode 301 is 130 to 190 nm), in each light-emitting element with a different volume percentage.

Figure 13:
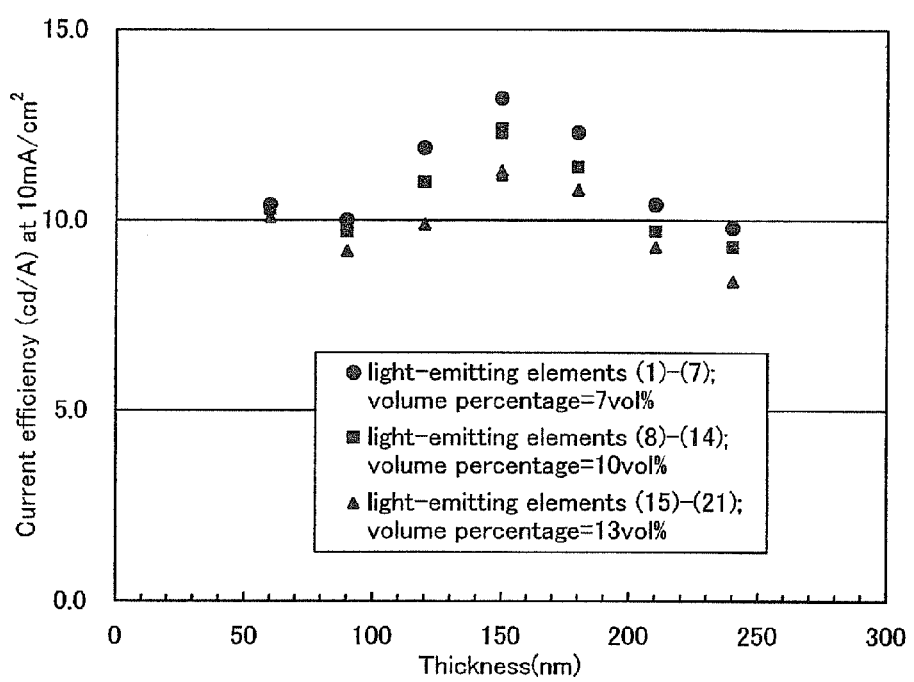
FIG. 13 is a graph showing variation of current efficiency with respect to a thickness of a mixed layer (first layer 311)
Figure 14:
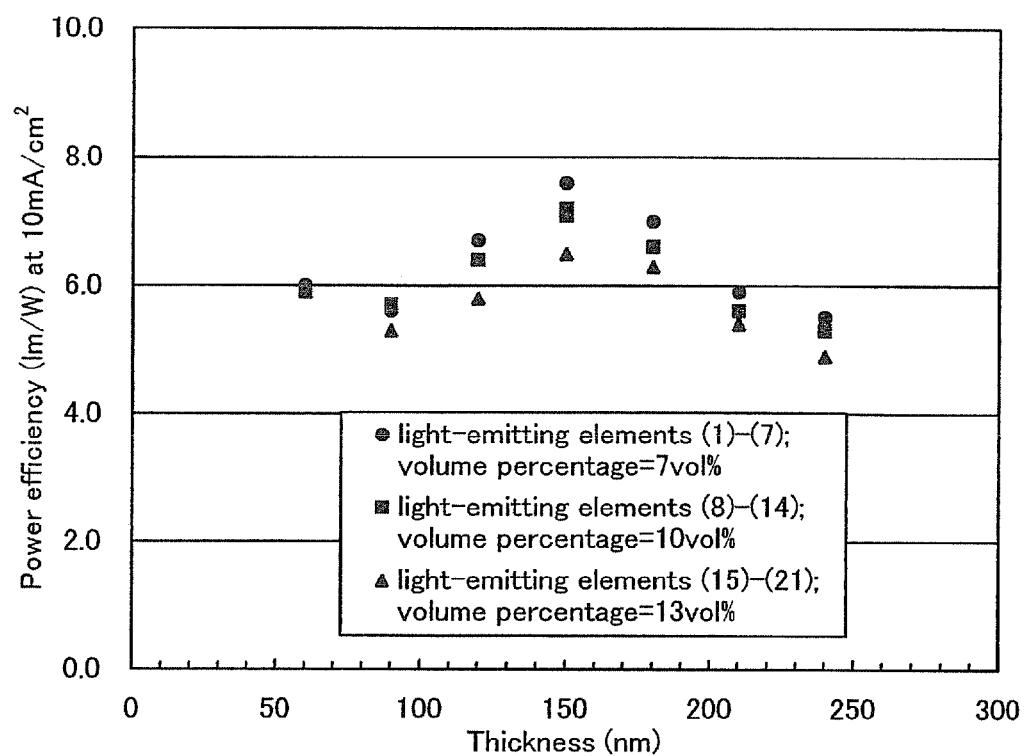
FIG. 14 is a graph showing variation of power efficiency with respect to a thickness of a mixed layer (first layer 311)

FIG. 13 is a graph in which after the light-emitting elements (1) to (21) were made to emit light at 10 $mA/cm^2$ and current efficiencies were measured, the current efficiencies [cd/A] (vertical axis) at 10 $mA/cm^2$ with respect to thicknesses of the first layers 311 [nm] (horizontal axis) were plotted. FIG. 14 is a graph in which after the light-emitting elements (1) to (21) were made to emit light at 10 $mA/cm^2$ and power efficiencies were measured, the power efficiencies [lm/W] (vertical axis) at 10 mA/cm² with respect to thicknesses of the first layers 311 [nm] (horizontal axis) were plotted.

In FIGS. 13 and 14, as in the case where the light-emitting elements were made to emit light at 10 mA/cm², it can be seen that the current efficiencies and power efficiencies were highest when the first layers 311 were 150 nm thick.

It can be considered that variation in power efficiency dependent on thicknesses of the first layers 311 as described above are a phenomenon primarily caused by a change in the amount of light emitted to outside from the light-emitting elements, which is a result of a change of the distance between the third layer 313 serving as a light-emitting layer and the electrode (i.e., a change of an optical path length) made by changing the thickness of the first layer 311.

EXAMPLE 2

In Example 2, in addition to the light-emitting elements (1) to (21) manufactured in Example 1, four light-emitting elements (22), (23), (24) and (25) were manufactured, in which volume percentage in a mixed layer in which a hole transporting substance and a metal oxide were mixed (volume percentage of the metal oxide with respect to the volume of the mixed layer) was 4 vol %, and thicknesses of the mixed layers (first layers 311) were 60 nm, 90 nm, 120 nm, and 150 nm, respectively.

Structures other than the mixed layers were formed similarly to the light-emitting elements (1) to (21), and thus the description in Example 1 may be referred to for description of the manufacturing method of the light-emitting elements (22) to (25).

Figure 15B:
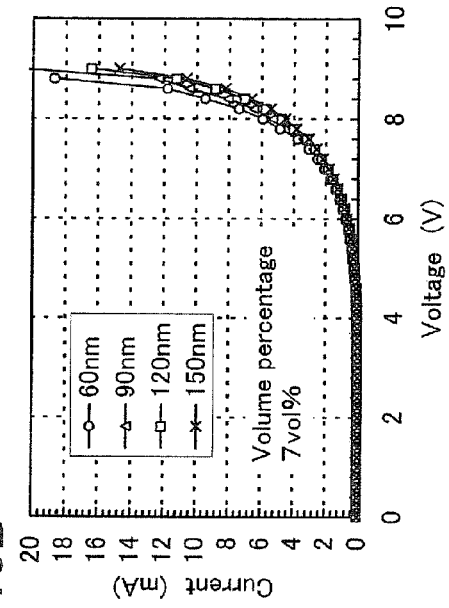
FIGS. 15A to 15D are graphs showing current-voltage characteristics of light-emitting elements manufactured in Examples 1 and 2.
Figure 15D:
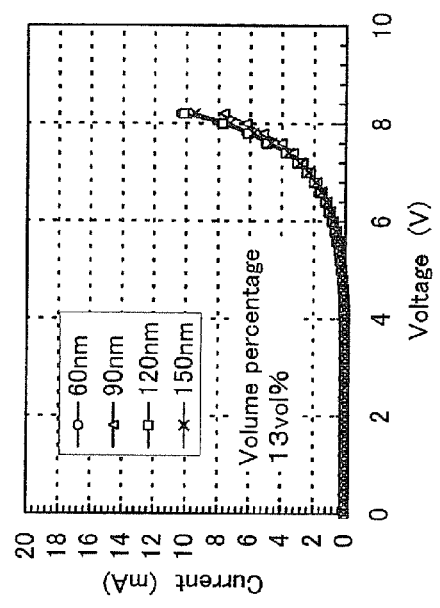
Figure 15A:
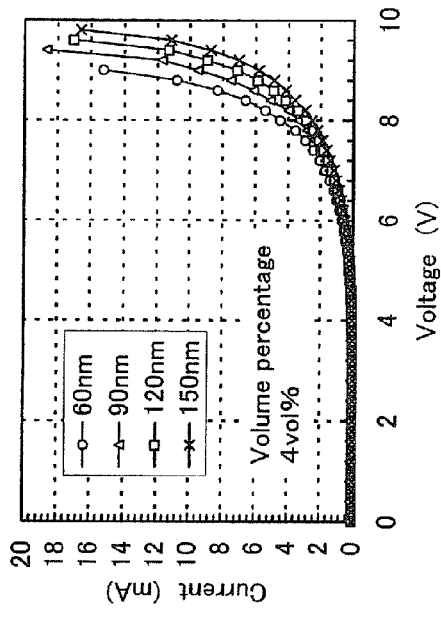
Figure 15C:
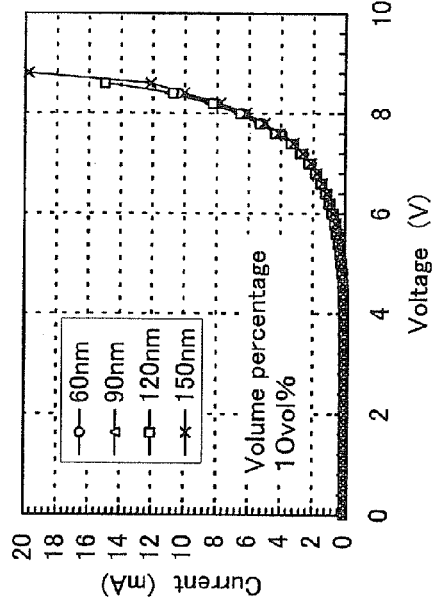

FIGS. 15A to 15D show current-voltage characteristics obtained when the light-emitting elements (1) to (4), (8) to (11), (15) to (18) and (22) to (25) were made to emit light. FIG. 15A shows current-voltage characteristics of the light-emitting elements (22) to (25) having a volume percentage of 4 vol %. FIG. 15B shows current-voltage characteristics of the light-emitting elements (1) to (4) having a volume percentage of 7 vol %. FIG. 15C shows current-voltage characteristics of the light-emitting elements (8) to (11) having a volume percentage of 10 vol %. FIG. 15D shows current-voltage characteristics of the light-emitting elements (15) to (18) having a volume percentage of 13 vol %. Note that in FIGS. 15A to 15D, vertical axes show current (mA) and horizontal axes show voltage (V).

As can be seen FIGS. 15A to 15D, it can be considered that as the volume percentages rise (in other words, as a concentration of molybdenum oxide, which is one of metal oxides, becomes higher), a difference of current-voltage characteristics dependent on the thickness of the mixed layer becomes smaller. Thus, it can be seen that the volume percentage of molybdenum oxide with respect to the mixed layer is preferably set higher than 4 vol % especially, in order to manufacture a light-emitting element in which a voltage to be applied for driving so that a constant current flows hardly changes depending on the thickness of the mixed layer.

The present application is based on Japanese Patent Application serial No. 2005-167620 filed on Jun. 8, 2005 in Japanese Patent Office, the entire contents of which are hereby incorporated by reference.

What is claimed is:

1. A light-emitting device comprising a light-emitting element, the light-emitting element comprising:
a layer comprising a hole transporting substance and a metal oxide having an electron accepting property to the hole transporting substance over a first electrode;
a light-emitting layer comprising a light-emitting substance over the layer;
an electron transporting layer comprising an electron transporting substance over the light-emitting layer; and
a second electrode over the light-emitting layer,
wherein the layer has a region whose thickness is 120 to 180 nm,
wherein the metal oxide is included in the region at a concentration of 7 vol % to 13 vol % with respect to the hole transporting substance, and
wherein a difference of hole mobility of the hole transporting substance and electron mobility of the electron transporting substance is 1000 or less.

2. The light-emitting device according to claim 1, wherein the metal oxide is molybdenum oxide.

3. The light-emitting device according to claim 1, wherein the metal oxide is molybdenum trioxide.

4. The light-emitting device according to claim 1, wherein the light-emitting layer emits green light.

5. The light-emitting device according to claim 1, wherein a total thickness between the light-emitting layer and the first electrode is in a range of 120 to 300 nm.

6. An electronic device comprising the light-emitting device according to claim 1, wherein the electronic device is selected from the group consisting of a personal computer, a portable phone, a television, a navigation system, and a lighting system.

7. A light-emitting device comprising a light-emitting element, the light-emitting element comprising:
a layer comprising a hole transporting substance and a metal oxide having an electron accepting property to the hole transporting substance over a first electrode;
a light-emitting layer comprising a light-emitting substance over the layer;
an electron transporting layer comprising an electron transporting substance over the light-emitting layer; and
a second electrode over the light-emitting layer,
wherein the layer has a region whose thickness is 120 to 180 nm,
wherein a molar ratio of the metal oxide to the hole transporting substance in the region is 1:4 to 2:4 metal oxide: hole transporting substance, and
wherein a difference of hole mobility of the hole transporting substance and electron mobility of the electron transporting substance is 1000 or less.

8. The light-emitting device according to claim 7, wherein the metal oxide is molybdenum oxide.

9. The light-emitting device according to claim 7, wherein the metal oxide is molybdenum trioxide.

10. The light-emitting device according to claim 7, wherein the light-emitting layer emits green light.

11. The light-emitting device according to claim 7, wherein a total thickness between the light-emitting layer and the first electrode is in a range of 120 to 300 nm.

12. An electronic device comprising the light-emitting device according to claim 7, wherein the electronic device is selected from the group consisting of a personal computer, a portable phone, a television, a navigation system, and a lighting system.

* * * * *